United States Patent [19]
Williams et al.

[11] Patent Number: 5,156,989
[45] Date of Patent: Oct. 20, 1992

[54] COMPLEMENTARY, ISOLATED DMOS IC TECHNOLOGY

[75] Inventors: Richard K. Williams, Cupertino; Richard A. Blanchard, Los Altos, both of Calif.

[73] Assignee: Siliconix, Incorporated, Santa Clara, Calif.

[21] Appl. No.: 268,839

[22] Filed: Nov. 8, 1988

[51] Int. Cl.⁵ .......................................... H01L 21/265
[52] U.S. Cl. .......................................... 437/41; 437/34; 437/57; 437/77; 437/74; 437/76; 148/DIG. 85
[58] Field of Search .................. 437/77, 41, 31, 34, 437/56, 57, 74, 76; 148/DIG. 85

[56] References Cited

U.S. PATENT DOCUMENTS

| | | | |
|---|---|---|---|
| 3,547,716 | 12/1970 | DeWitt et al. | 437/77 |
| 3,769,105 | 10/1973 | Chen et al. | 437/77 |
| 3,787,253 | 1/1974 | Ashar | 437/77 |
| 3,802,968 | 4/1974 | Ghosh et al. | 437/77 |
| 3,865,648 | 2/1975 | Castrucci et al. | 437/77 |
| 3,929,526 | 12/1975 | Nuttall et al. | 437/77 |

FOREIGN PATENT DOCUMENTS 0003806  1/1980  Japan ...................................... 437/77

Primary Examiner—Brian E. Hearn
Assistant Examiner—Tuan Nguyen
Attorney, Agent, or Firm—Skjerven, Morrill, MacPherson, Franklin & Friel

[57] ABSTRACT

A process sequence that produces a plurality of pretransistor structures from which a variety of high voltage, isolated integrated circuits and low voltage integrated circuits are easily fabricated.

20 Claims, 28 Drawing Sheets

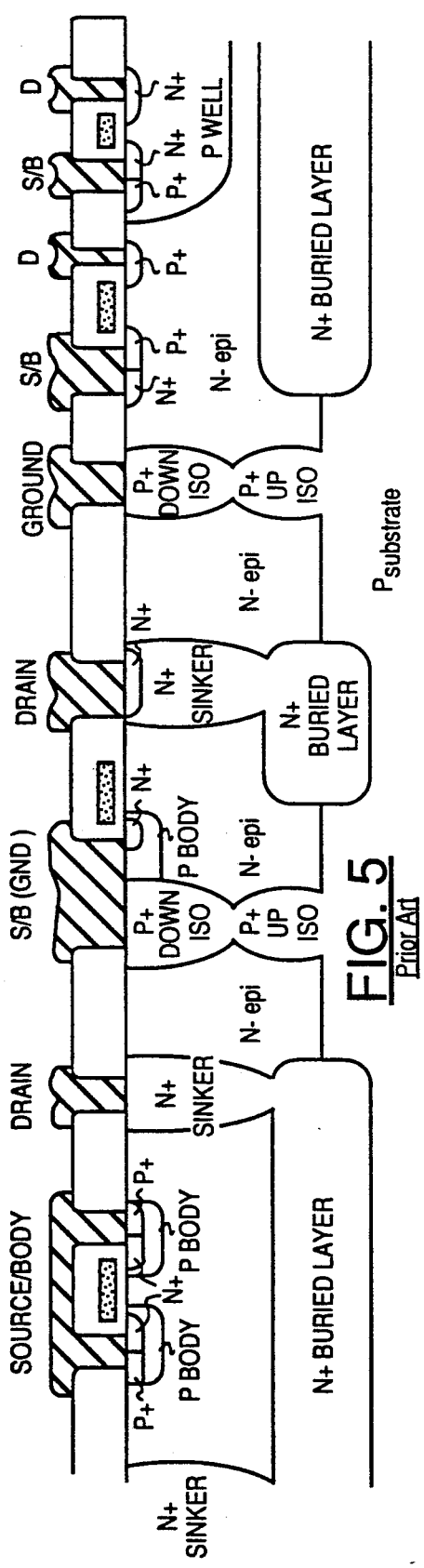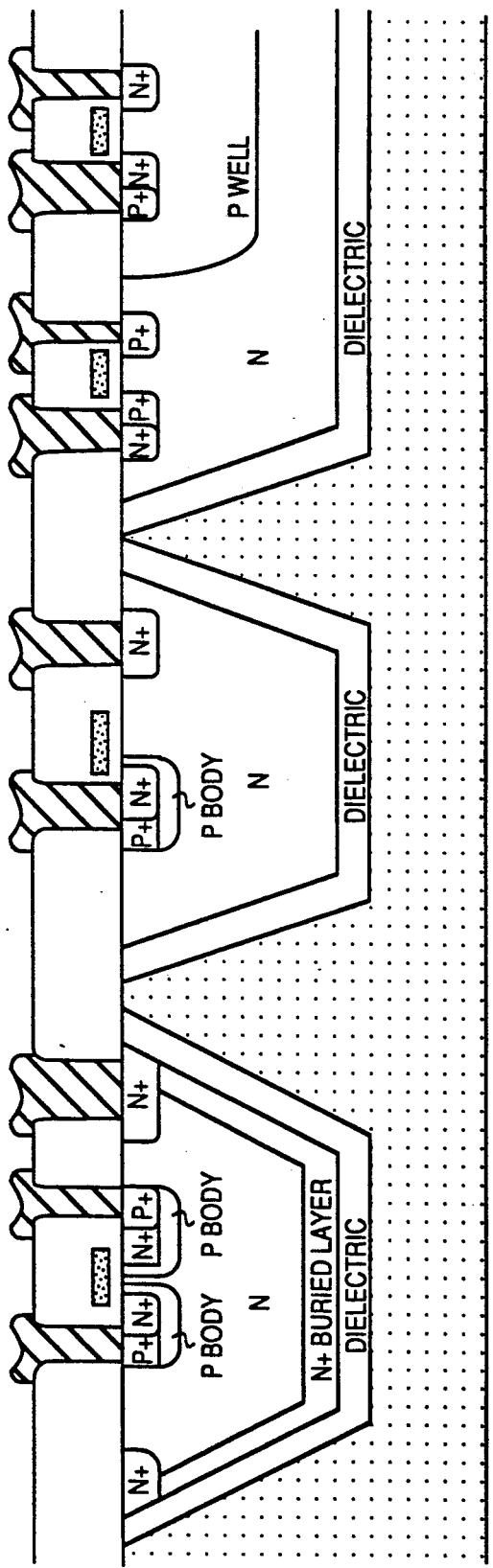
FIG. 5 Prior Art
FIG. 7 Prior Art

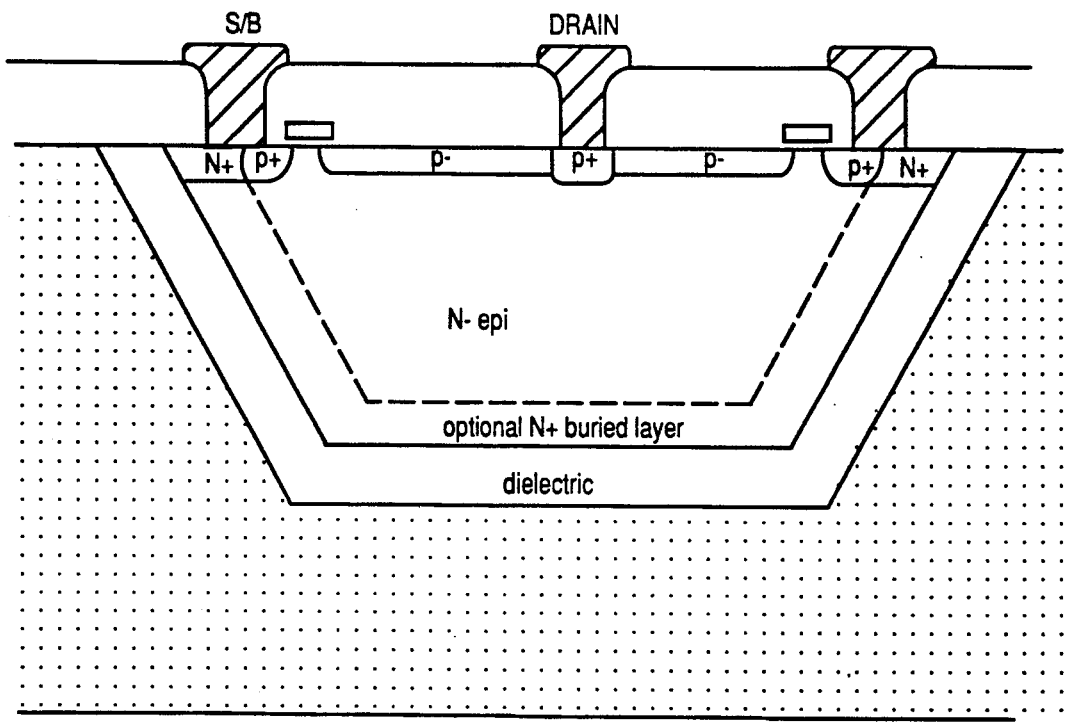
FIG. 8
Prior Art
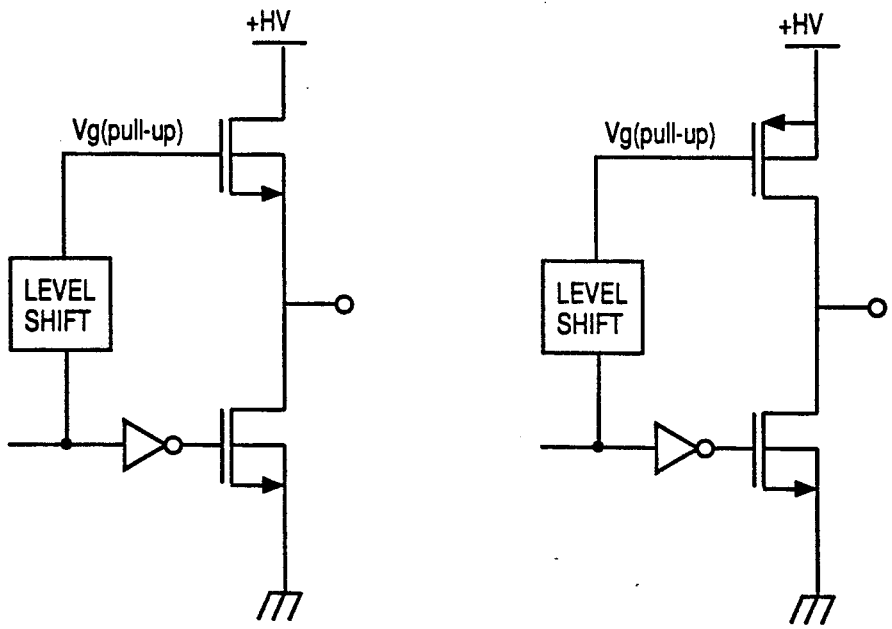
FIG. 9A
Prior Art
FIG. 9B
Prior Art

COMPLEMENTARY, ISOLATED DMOS IC TECHNOLOGY

FIELD OF THE INVENTION

The invention relates to a process sequence that permits fabrication of a variety of isolated, high voltage, integrated circuit devices and to the resulting structures.

BACKGROUND OF THE INVENTION

Most conventional low-voltage integrated circuit processes are incapable of monolithically integrating a variety of parasitic-free high-voltage devices needed to fabricate circuits controlling high-voltage loads, particularly when a high-voltage push-pull (source-sink) output stage is required.

At least four isolation techniques (self isolation, RESURF junction isolation, conventional junction isolation and dielectric isolation) have been used in the prior art to achieve high voltage isolation for power integrated circuits. Baliga briefly reviews the characteristics of each of these techniques in I.E.E.E. Trans. on Electron Devices ED-33 1936 (1986).

Self isolation ("SI") uses a reverse biased junction between the source-drain regions and a common body region to obtain isolation. In one version relating to a class of CMOS devices, shown in FIG. 1, a p− substrate serves as the body region for one or more n-channel field effect transistors, with two n+ islands in the p substrate forming the source and drain of each NMOS transistor and with two p+ islands in an n-well forming each PMOS transistor. Where the substrate doping is light (dopant concentration $\leq 3 \times 10^{14}$ cm$^{-3}$) to facilitate high-voltage breakdowns, the low-voltage NMOS transistor may require diffusion to form a $p_{body}$, to make voltage breakdown thresholds over 0.8V available and to avoid punchthrough breakdowns between source and drain regions. A $p_{body}$ region in an NMOS transistor is a p type region of moderate doping concentration that surrounds the source region in order to increase source-drain voltage breakdown threshold. High-voltage n-channel devices are fabricated using lightly doped n− drift region adjacent to the drain to provide field shaping; this also uses a technique known as lateral charge control, where the drift charge dose is approximately $10^{12}$ cm$^{-2}$. Although the drain of each high-voltage NMOS device must be surrounded by an n-drift region, it is optional whether the gate and source also surround the drain and form a familiar "annular device" well described in the literature. As used herein, the term "annular region" refers to a three-dimensional region that is cylindrically shaped, where the cylinder cross-section is not necessarily circular. The high voltage n-channel MOS transistor typically employs a $p_{body}$ diffusion region, producing a lateral DMOS transistor. A DMOS transistor is formed by two consecutive diffusions of dopants of opposite electrical conductivity type (for example, first p type dopant, then n type dopant) in a region of semiconductor material; this produces two adjacent regions of different conductivity type that are used to control current in the transistor. A lateral MOS transistor, as shown in FIG. 1, is one in which charged particle flow from source to drain, or from drain to source, is substantially horizontal. An LDMOS transistor is a DMOS transistor in which current is substantially lateral. A self-isolation process allows the monolithic integration of low voltage (<20V) CMOS devices and high-voltage (60V to 1,000V) n-channel lateral DMOS devices used for current sinking as a voltage pull-down device.

High voltage PMOS devices can be implemented by inclusion of additional process steps to provide a high-voltage pull-up device and to achieve high voltage source-sink output capability. FIG. 2A shows how the addition of a p-drift region extension on a PMOS device, fabricated in an n-well, can be used to integrate a high voltage PMOS device into architecture produced by an SI process architecture. Provided that the p substrate is doped considerably lighter than the diffused n-well region, punchthrough breakdown from drain to substrate is avoided. Inclusion of an n+ buried layer, as shown in FIG. 2B, may eliminate voltage snap back, whereby bipolar transistor breakdown voltage $BV_{ceo}$ is abruptly lowered, substrate current is increased and the chances for device failure or destruction are increased. Inclusion of the n+ buried layer in FIG. 2B degrades the $\beta$ parameter for current gain of the vertical parasitic substrate pnp; but this introduces a diode breakdown mechanism between the p+ drain and the n+ buried layer. For reasonable epitaxial layer thicknesses ($\cong 15$ to 20 $\mu$m) and reasonable diffusion times so that the buried n+ layer connects with the n-well region, this diode breakdown is restricted to voltages above 200V.

RESURF Junction Isolation or JIR, which is another high voltage process (see FIG. 3), achieves high breakdown voltages (60 to 1200V) in an n-channel device by forming a lateral charge control region that has a charge density of $\cong 10^{12}$ cm$^{-2}$ adjacent to a thin (5-8 $\mu$m) n− epitaxial layer. The n− epi layer forms a drift region analogous to the implanted lightly doped drain region in an SI process. Because this process is carried out epitaxially using a common n− layer on a p substrate, p+ isolation is required to separate the NMOS drain from other devices. Because the epitaxial layer is thin, isolation is easily accomplished with a single down-isolation diffusion. In a down-isolation (up-isolation) diffusion, rapidly diffusing dopant, B or Al for p type dopant and P for n type dopant, is introduced in a thin deposit at the top (bottom) of a layer of semiconductor material, and the dopant is allowed to diffuse vertically downward (upward) into the layer adjacent to the dopant deposit. This structure was introduced by Appels and Vaes in "High Voltage Thin Layer Devices." IEDM Tech Digest, pp. 230-241 (1979). The charge control region redistributes the surface electric field; hence its name "reduced-surface field" (RESURF). As with an SI n-channel MOS device with lightly doped drain, the maximum voltage of a device produced with JIR is determined by the n+ drain to p substrate breakdown voltage; this voltage can be made high if a lightly doped p substrate is used. The breakdown voltage of the NMOS device is selected by the gate-to-drain distance, as with an SI device with lightly doped drain; no process alteration is required to vary this breakdown voltage, provided the voltage is less than the n+ drain to p substrate breakdown voltage.

To avoid punchthrough breakdown or parasitic bipolar action in low voltage CMOS areas, an n+ buried layer and (optional) sinker are employed. PMOS devices are fabricated in the n− epitaxial layer, and NMOS devices are constructed in a diffused p-well that is surrounded by the n+ buried layer and sinker. The p-well is disconnected electrically from the substrate when it is desirable. Otherwise, the p-well containing the NMOS device may contact the p substrate.

Because the epi layer is lightly doped to form an n− charge control region, monolithic integration of a high-voltage PMOS device is severely limited by punch-through breakdown and by parasitic pnp transistor snap back. FIG. 4A illustrates that formation of the high-voltage PMOS source produces a parasitic diode D1, which requires separation by a full drift length $L_d$ of the n+ contact from the p+ isolation region to prevent avalanche. The structure of FIG. 4A also has a parasitic bipolar transistor Q1 associated with the source; this transistor will punch through to the substrate in the presence of less than 60V bias. The drain also exhibits this punchthrough effect with a parasitic transistor Q2; and Q2 will exhibit a super-beta (very high current gain) pnp characteristic that has very low snap back voltage due to low breakdown voltage threshold $BV_{ceo}$. Addition of the n+ buried layer shown in FIG. 4B eliminates Q1 and Q2, but this requires a newly formed diode D3 connected from p+ source to n+ buried layer diode to support a high voltage supply without avalanching. Due to the presence of the thin epi layer, the high voltage supply is restricted to voltage differences below 100V at best. Use of a thicker epi layer requires use of deeper p+ isolation diffusions and deeper sinker diffusions and eliminates many of the cost benefits of JIR.

Scaling JIR to thicker dimensions may also require increase of the drift charge beyond the maximum charge allowed by JIR. This scaling process is known as conventional junction-isolation (JIC) and is illustrated in FIG. 5. A thick n− epi layer (typically 8 to 50 μm thickness) is grown over a p substrate and is isolated by p+ isolation regions as shown. Using a rapidly diffusing p type dopant, such as boron or aluminum, the p+ isolation may be achieved (1) by using a single down-isolation diffusion directed vertically downward into an epi layer; or (2) by using a buried layer together with an up-isolation diffusion, directed vertically upward into the epi layer from the bottom, and a down-isolation diffusion, directed vertically downward from the top surface of the epi, where the two diffusing dopant profiles meet and merge within the epi layer and form a single wrap-around isolation region that extends from the buried layer upward to the top surface of the epi layer. A wrap-around isolation region is annular region of semiconductor material, heavily doped of one electrical conductivity type, that laterally surrounds a region of semiconductor material of a second electrical conductivity type that is to be electrically isolated from semiconductor material that lies outside a cylinder defined by the annular region. For net epi layer thicknesses beyond 30 μm, the epi growth is sometimes split into two steps, with an additional mid-isolation diffusion mask and implant included between the upper and lower epi layers to form an up-, middle- and down-isolation regions. Low voltage logic is formed in an isolated n− epi region, with a low voltage PMOS device being formed directly in the n− epi material and a low-voltage NMOS device being formed in a diffused p-well. An optional n+ buried layer, formed by introducing a slowly diffusing material such as antimony or arsenic at the substrate-epi layer junction, may be used to suppress parasitic substrate bipolar action. This buried layer is also used to reduce the resistance of the drain region of a high voltage lateral device in the on-state, or of a vertical DMOS region formed by the inclusion of a $p_{body}$ diffusion region that is self-aligned to the polysilicon gate. In such devices, the n− epi layer serves as the drain region and has an n+ contact region on its surface. The n+ source region in such a device is enclosed totally by a deeper $p_{body}$ region and must be surrounded at the surface on all sides either by the polysilicon gate or by the p+ region. Although vertical DMOS transistor action is possible in this situation, device action is lateral in the sense that current is collected by a drain contact on the surface of the device. An optional n+ sinker may be included to connect the drain contact at the top to the n+ buried layer and to further reduce resistance.

FIG. 6 shows a high-voltage PMOS transistor with lightly doped drain (p−) integrated into JIC using p+ up-isolation and down-isolation regions that laterally surround the device. To prevent punchthrough and parasitic substrate PNP snap back (which prevented high voltage PMOS integration into the RESURF process), the JIC process uses a slowly diffusing n+ dopant to form a buried layer and a faster diffusing n+ dopant to form a sinker region to totally enclose the PMOS device shown in FIG. 6, thereby avoiding both lateral and vertical parasitic pnp transistor action. Unlike the high voltage NMOS situation, where the n+ region is used only to reduce resistance in the on-state, the high voltage p-channel with lightly doped drain requires that the n+ sinker region contact the n+ buried layer. Furthermore, the device must be surrounded by both the n+ sinker region and a p+ vertical isolation region so that the device is both complex and large. Where a thicker epi layer is used the n+ sinker region must be replaced by a sinker region having both up-isolation and down-isolation regions; and for even thicker epi layers by a sinker having up-isolation, mid-isolation and down-isolation regions. This requires use of an unreasonable number of masks in the process. A comparison of the number of masks required is shown in Table 1 below. A base process is assumed for a two-mask LOCOS process, well, p+, n+ and $p_{body}$ masks, polysilicon, contact, metal, passivation, and a drift mask for high voltage.

TABLE 1

| | Max Breakdown Voltage JIC PROCESS | | | |
|---|---|---|---|---|
| | 60 V | 100 V | 250 V | 500 V |
| Base Process | 11 masks | 11 masks | 11 masks | 11 masks |
| n+ Buried Layer | X | X | X | X |
| p+ Isolation: | | | | |
| Up | | X | X | X |
| Middle | | | | X |
| Down | X | X | X | X |
| n+ Sinker: | | | | |
| Up | | | X | X |
| Middle | | | | X |
| Down | X | X | X | X |
| Total Masks | 14 | 15 | 16 | 18 |

Because three to seven masks may be required to achieve parasitic-free isolation of complimentary devices at high voltages, a fourth process known as dielectric isolation (DI) provides another process alternative. Dielectric isolation, illustrated in FIG. 7, uses the interior of a specially designed tub, filled with n− single crystal silicon and lined with a thick dielectric layer at the bottom and sides of the tub. The isolated region within the tub is completely free of tub-to-tub parasitics and is ideally suited for high voltage applications. The conventional junction-isolated process sequence is often used to form devices within the tubs, except that the buried layer, isolation and sinker portions of the process are deleted. High-voltage p-channel devices formed using DI are also parasitic-free, as indicated in FIG. 8.

Formation of a dielectrically isolated tub of single crystal silicon is a costly procedure, involving patterning and v-groove etching of silicon, provision of a thick field oxidization, deposition of over 20 mil of polysilicon, and controlled grinding, lapping and polishing of the single crystal silicon to a thickness where each single crystal region is separated by the v-grooves with dielectric edges. Both the polysilicon deposition and the grinding procedures are expensive, however. Because the final wafer thickness is primarily polysilicon, the wafers are more fragile than is a single crystal wafer. As a result, the net cost of DI starting material is two to four times the cost of conventional silicon wafers.

forms part of an isolation region. These patents do not disclose use of a heavily doped region of a single electrical conductivity type, surrounding an enclosed region on the bottom and sides, to form an enclosed region.

Integrated circuits with isolation regions have been disclosed by Peltzer in U.S. Pat. No. 3,648,125. However, the substrate and covering or epitaxial layer in Peltzer are of different electrical conductivity types, one being p type material and one being n type material. In the Peltzer patent, the isolation regions are oxidized and the buried layer is spaced apart from the isolation region.

SUMMARY OF THE INVENTION

In accordance with this invention, fabrication of a high-voltage p-channel is simplified from that of conventional junction-isolation devices by combining the

TABLE 2

| EVALUATION | SI | JIR | JIC | DI |
|---|---|---|---|---|
| PROCESS | | | | |
| substrate doping | p− | p− | p− | n |
| epi layer doping | p−(optional) | n− | n | none |
| isolation diffusions | none | p+ down | p+ up/down | none (oxide) |
| complexity/cost | medium | medium | high | high |
| LV CMOS | | | | |
| n-channel | LDMOS in p sub | NMOS in p well | NMOS in p well | NMOS in p well |
| p-channel | PMOS in n well | PMOS in n epi | PMOS in n epi | PMOS in n sub |
| HV n-channel MOS | | | | |
| description | LDD LDMOS in p sub | RESURF NEPI LDMOS | LDMOS/VDMOS w/N+ B/L | LDMOS/VDMOS w/N+ B/L |
| BVdss | 60 to 1200 V | 60 to 1200 V | 60 to 600 V | 60 to 600 V |
| operation | pull down | pull down pull up | pull down pull up | pull down pull up |
| HV p-channel MOS | | | | |
| description | LDD PMOS in n well | LDD PMOS in $n_{epi}$ | LDD PMOS in $n_{epi}$ | LDD PMOS in n sub |
| DV$_{dss}$ | 60 to 200 V | 60 V | 60 to 600 V | 60 to 600 V |
| operation | pull up | pull up | pull up | pull up |
| parasitic suppression | n+ buried layer/ sinker (option) | n+ buried layer/ sinker | n+ buried layer/ sinker | oxide isolation |

Table 2 summarizes the four processes discussed thus far Although a number of these processes are capable of implementing a high-voltage push-pull output stage using an all n-channel design as shown in FIG. 9A, in practice, the driver circuitry for the pull-up n-channel is slow and complex in order to drive the gate voltage $V_g$ (pull-up) 10V above the high-voltage supply +HV. Unless such a technique is used, the highest gate voltage available is +HV, and the pull-up n-channel will turn off before the output voltage can reach +HV. FIG. 9B shows a push-pull configuration using true complementary devices. In such devices, the p-channel gate voltage is tied to +HV for its off-state and is pulled down toward ground to turn the device on. No special supply voltages or gate drive schemes are required to implement full rail-to-rail output swing. From Table 2 it is clear that only the complex and costly conventional junction-isolated (JIC) and dielectric isolation (DI) processes are capable of providing complimentary output stages with breakdown voltages above 200V. Many display driver and switch-mode power supply devices require such capability. What is needed here is a junction-isolated process capable of monolithically integrating parasitic-free, high voltage n-channel and p-channel devices in a minimum number of masking steps.

Noyce discloses use of a pair of p-n junctions (reverse biased) to provide an isolation region between semiconductor zones, in U.S. Pat. No. 3,117,260. In U.S. Pat. No. 3,150,299, Noyce discloses use of intrinsic silicon between p type and n type semiconductor material that function of isolation, which normally requires deep p+ isolation diffusion(s), and the parasitic suppression, normally requiring deep sinker diffusion(s), into a single "wrap-around" n+ isolation region that fulfills both functions simultaneously. The combination of a p-channel LDMOS process with a wrap-around isolation process to produce a self-isolated process allows both low- and high-voltage complementary devices to be monolithically integrated, hence the name complementary isolation (CI). Because the wrap-around n+ isolation region forms a reverse-biased junction relative to the surrounding grounded p type substrate, the entire n+ isolation region is self-isolated from other high-voltage n-channel drains or other n+ wrap-around isolation regions. The p-channel device contained inside the wrap-around isolation region is free of parasitic substrate pnp related problems because the wrap-around n+ material acts as a degenerately doped base of the bipolar transistor The need for isolation diffusion is eliminated in the CI process because unlike the JIR or JIC processes, which employ an n epi layer grown over a p substrate, the CI process uses a p epi layer grown on a p substrate. Consequently, any n type region is self-isolated from another n type region. The benefits in reduced mask count available using the CI process rather than JIC, can be determined by reviewing Table 1 and eliminating the one to three p+ isolation masks required there (depending on the voltage). The number of masks is reduced from 18 to 15 in the worst case (500V) and from 16 to 14 for 250V complementary output stages.

One object of the invention is to provide a process sequence that allows fabrication of a variety of integrated circuit devices, wherein the initial steps of the process are identical for all devices.

Another object is to provide methods for fabricating high voltage IC devices where certain parasitic effects are suppressed.

Other objects of the invention, and advantages thereof, will become clear by reference to the detailed description and the accompanying drawings.

In accordance with this invention, a method for achieving the foregoing and other objects of the invention is provided that, in one embodiment, includes the steps of providing a substrate and a covering layer, both of semiconductor material of a first electrical conductivity type (for example, p type) with the covering layer overlying the substrate and defining an interface where the substrate and the covering layer meet. A heavily doped buried layer of a second electrical conductivity type (for example, n type) is then provided adjacent to a portion of the substrate-covering layer interface. A substantially annular isolation region of heavily doped second conductivity type is then formed in the covering layer that abuts and laterally surrounds the buried layer and extends from the buried layer to a top surface of the covering layer. The buried layer, the isolation region and the top surface of the covering layer define and bound an enclosed region of the covering layer that may be electrically isolated from the substrate and from the remainder of the covering layer Part or all of the semiconductor material in the enclosed region may be converted to second conductivity type.

In accordance with this invention, apparatus is provided that, in one embodiment, includes a semiconductor substrate and an overlying covering layer, both of first electrical conductivity type, that meet at an interface. A buried layer of heavily doped second electrical conductivity type is positioned adjacent to a portion of the interface; and a substantially annular region of heavily doped second conductivity type is formed that laterally surrounds and abuts the buried layer and extends from the interface to a top surface of the covering layer. The buried layer, the isolation region and the top surface of the covering layer form an enclosed region that may be electrically isolated from the substrate and from the remainder of the covering layer Part or all of the semiconductor material in the isolation region may be converted to second conductivity type for some applications, and many kinds of bipolar and MOS transistors may be fabricated using this apparatus.

As noted above, this apparatus: (1) provides self-isolated regions that will permit voltage differentials (inside versus outside) up to 600 volts; (2) allows increased packing density for the active devices; and (3) requires fewer masks to fabricate than is required for other comparable apparatus.

BRIEF DESCRIPTION OF THE DRAWINGS

FIG. 5 is a schematic cross-sectional view of a thick epitaxial layer, junction-isolated D/CMOS device illustrating vertical and lateral n-channel HV DMOS device and low voltage CMOS device.

FIG. 7 is a schematic cross-sectional view of a V-groove, dielectrically-isolated D/CMOS technology showing vertical and lateral n-channel high voltage DMOS and low voltage CMOS devices.

FIG. 8 is a schematic cross-sectional view of a V-groove dielectrically isolated D/CMOS technology showing a lateral high voltage PMOS device.

FIGS. 9A and 9B are schematic views of two circuit topologies that employ a common source, n-channel high voltage pull-down device with (a) a high voltage, source follower n-channel pull-up device and (b) a high voltage common source p-channel pull-up device.

DESCRIPTION OF A PREFERRED EMBODIMENT

Figure 1:
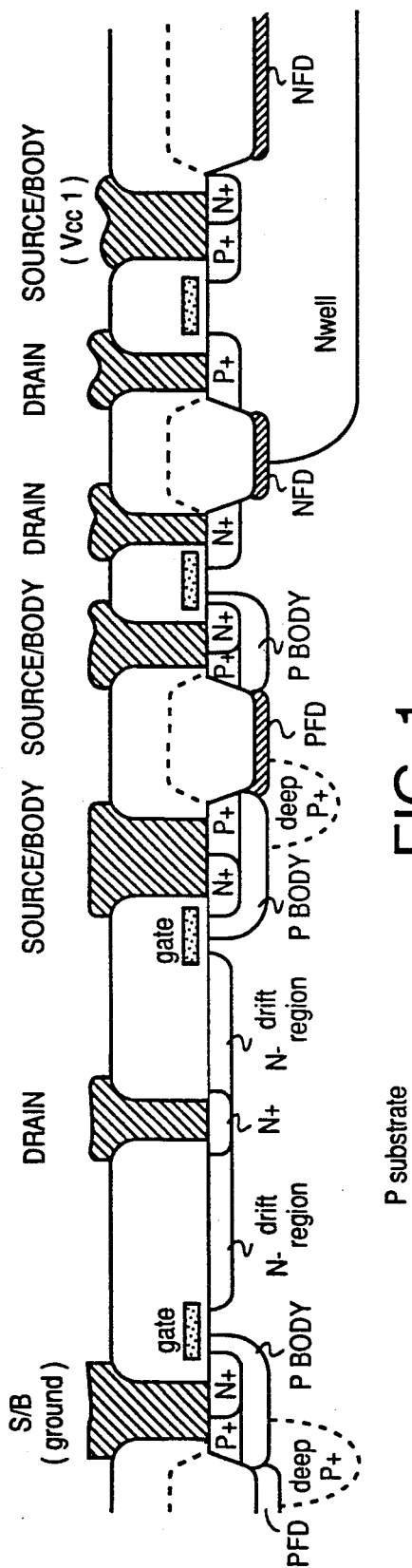
FIG. 1 is a schematic cross-sectional view of a self-isolated D/CMOS device showing an open drain high voltage n-channel LDD (lightly doped drain) lateral DMOS device and a low voltage CMOS device.
Figure 3:
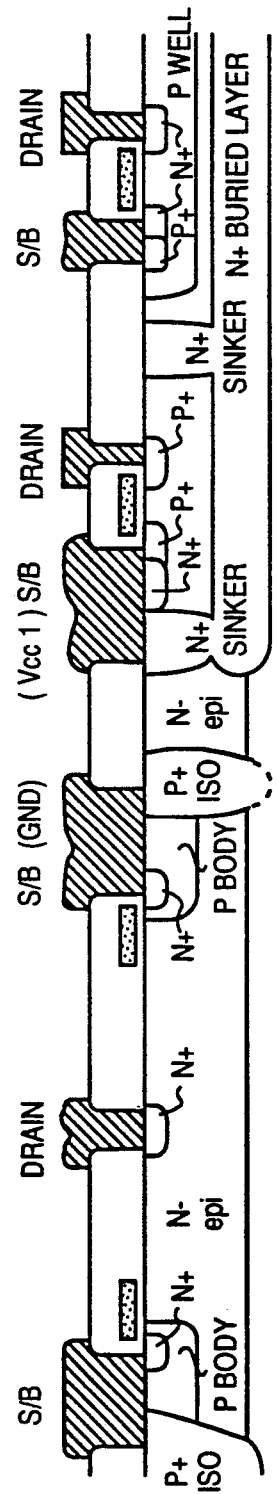
FIG. 3 is a schematic cross-sectional view of a junction-isolated D/CMOS device showing an open drain HV n-channel resurf lateral DMOS and low voltage CMOS.
Figure 2A:
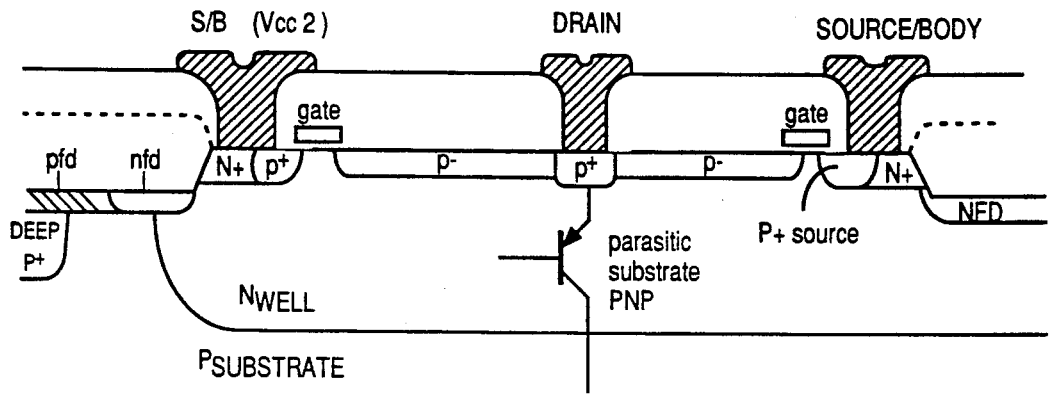
FIGS. 2A and 2B are schematic cross-sectional views of a self-isolated D/CMOS process implementation of a high voltage, lightly doped drain PMOS device (a) without buried layer and (b) with buried layer included for vertical pnp suppression.
Figure 2B:
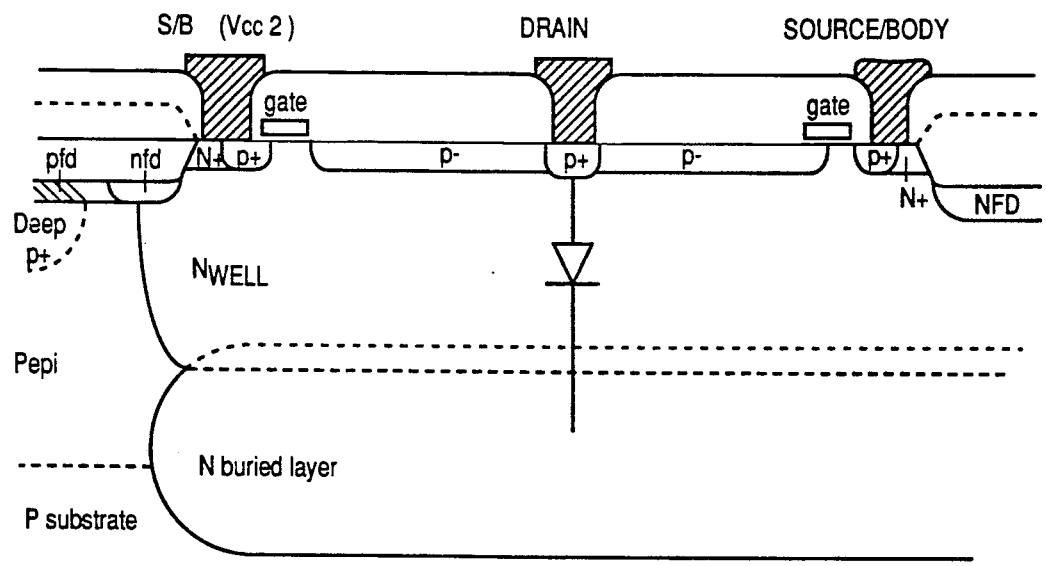
Figure 4A:
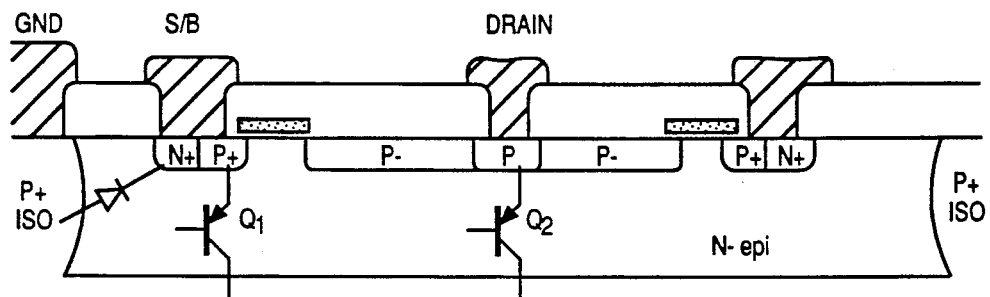
FIGS. 4A and 4B are schematic cross-sectional views of a junction-isolated resurf technology illustrating problems encountered in high voltage p-channel implementation, including (a) parasitic vertical pnp action and punchthrough and (b) breakdown voltage degradation due to presence of a buried layer.
Figure 4B:
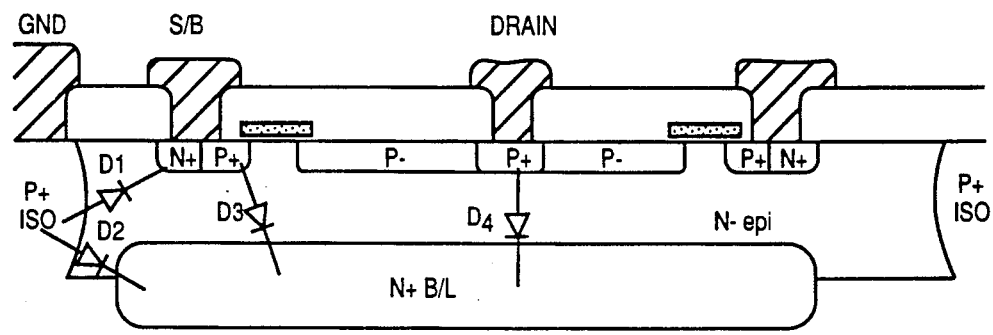
Figure 6:
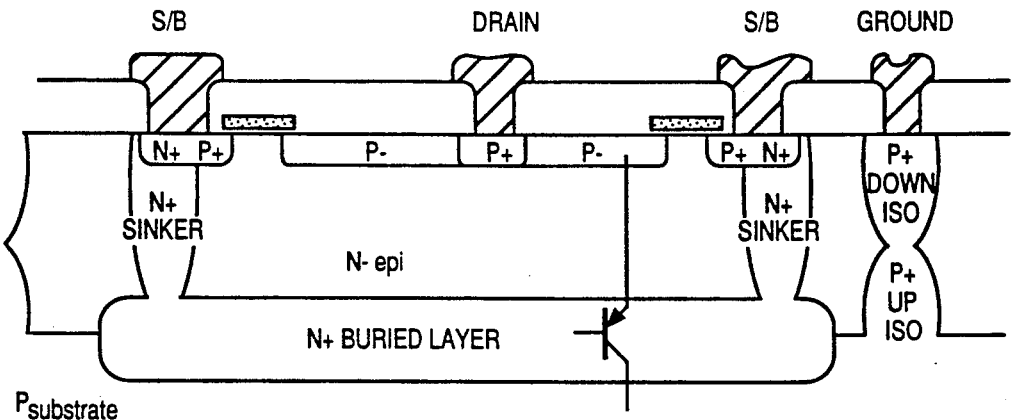
FIG. 6 is a schematic cross-sectional view of a thick epitaxial layer, junction-isolated D/CMOS process implementation for a high voltage LDD PMOS device, illustrating vertical pnp parasitic transistor suppression using an n+ sinker and an n+ buried layer.
Figure 10:
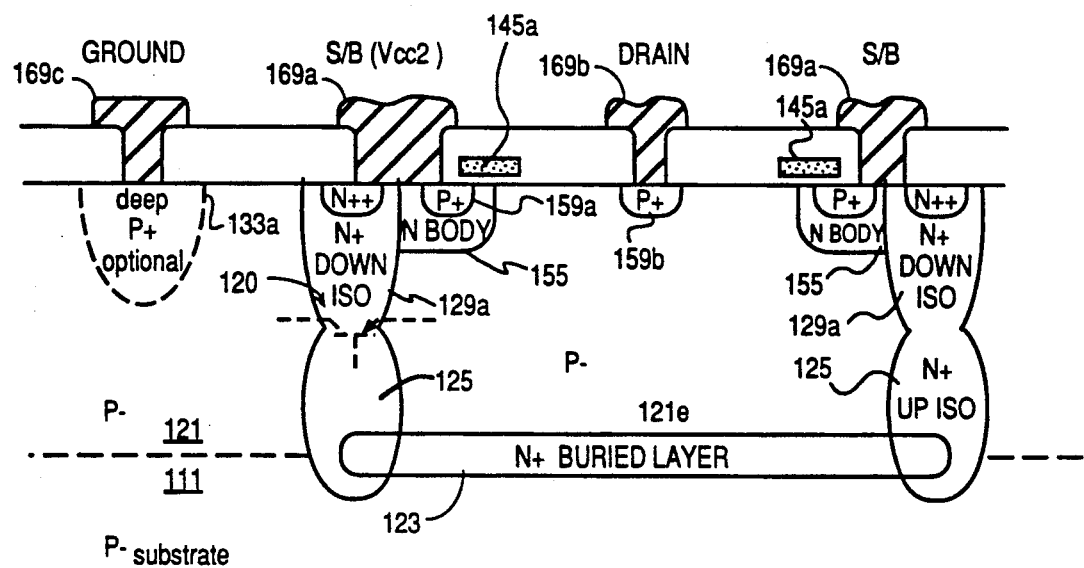
FIG. 10 is a schematic cross-sectional view of a complementary, isolated D/CMOS device, implemented according to the invention, that provides high voltage p-channel, lateral DMOS using n+ wrap-around isolation.
Figure 14:
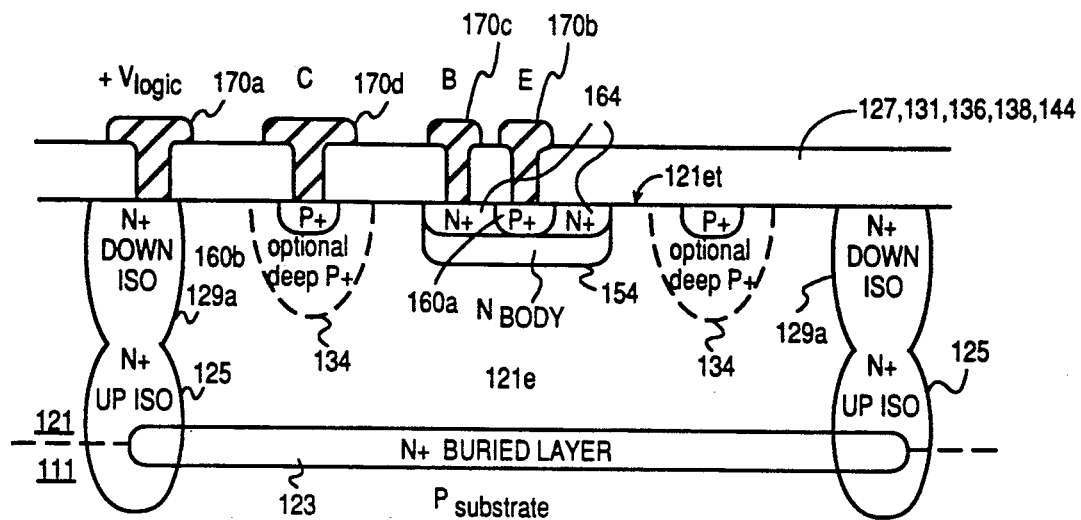
FIG. 14 is a schematic cross-sectional view of a complementary isolated D/CMOS device, implemented according to the invention, that provides a vertical isolated pnp bipolar transistor using wrap-around n+ isolation.
Figure 15:
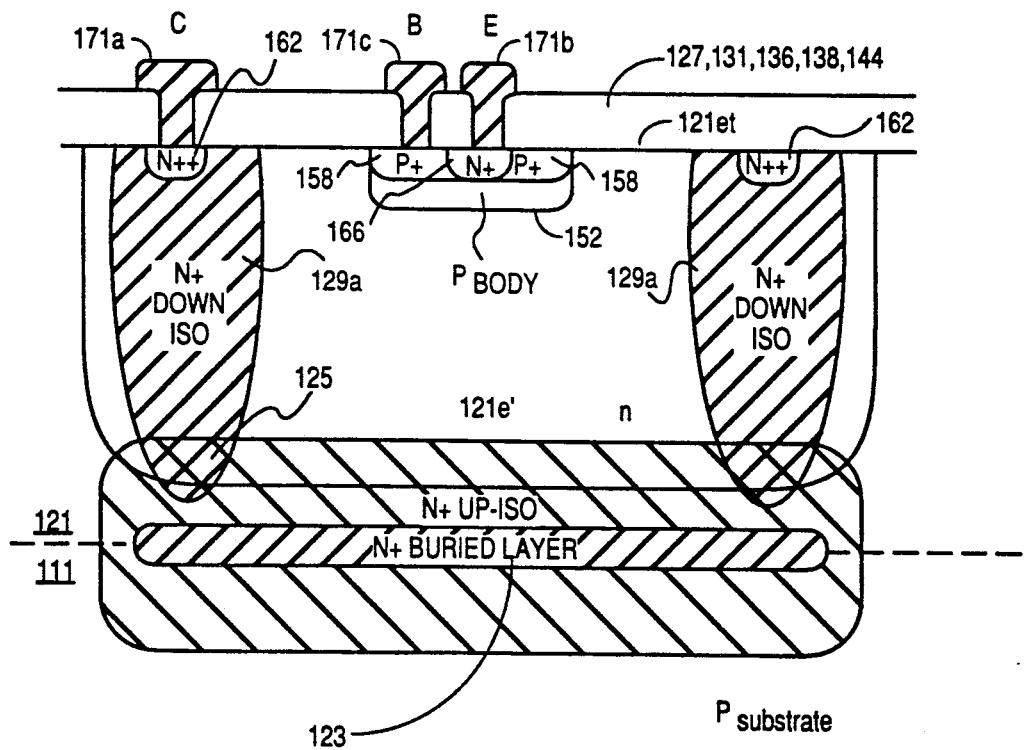
FIG. 15 is a schematic cross-sectional view of a complementary isolated D/CMOS device according to the invention that provides a vertical isolated npn bipolar transistor in an n-well with optional buried layer, n+ up-isolation and n+ down-isolation sinker diffusion.
Figure 16:
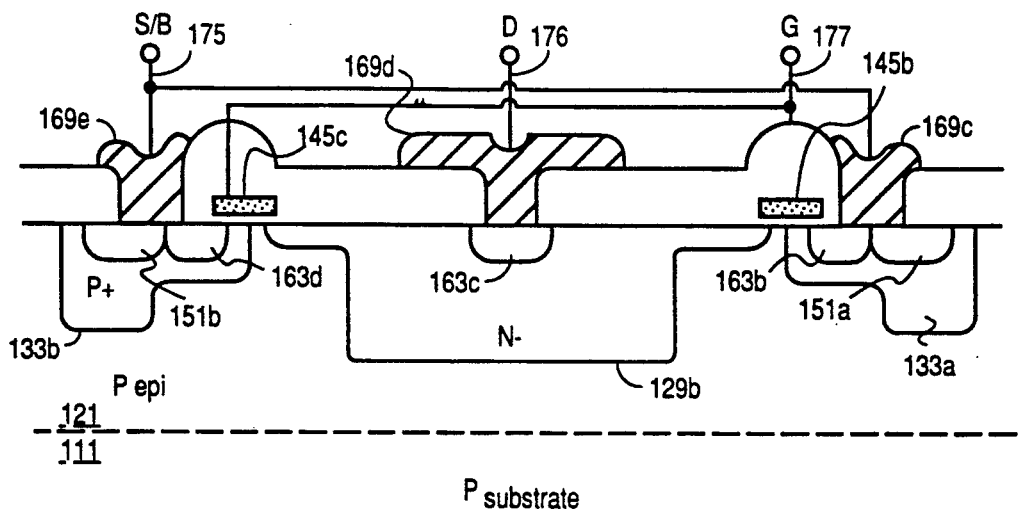
FIG. 16 is a schematic cross-sectional view of a high voltage, lateral drift drain, n-channel DMOS transistor fabricated according to the invention.
Figure 17:
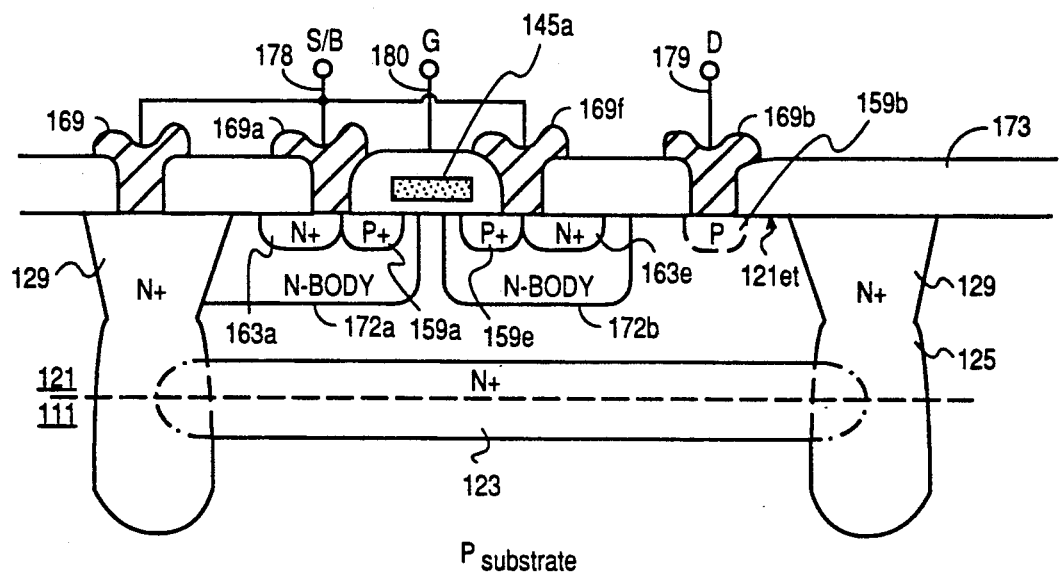
FIG. 17 is a schematic cross-sectional view of a high voltage, vertical-lateral p-channel DMOS transistor fabricated according to the invention.
Figure 23:
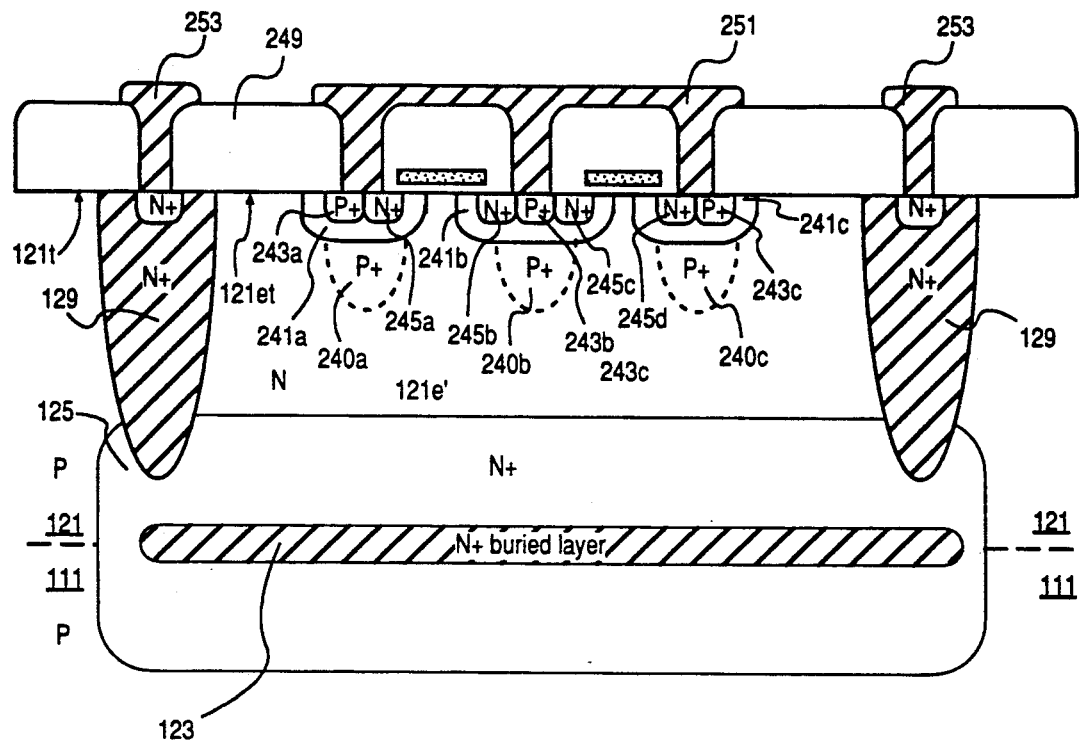
FIG. 23 is a schematic cross-sectional view of a high voltage n-channel vertical-lateral DMOS device fabricated in accordance with the invention having reduced drain resistance fabricated according to the invention.
Figure 24:
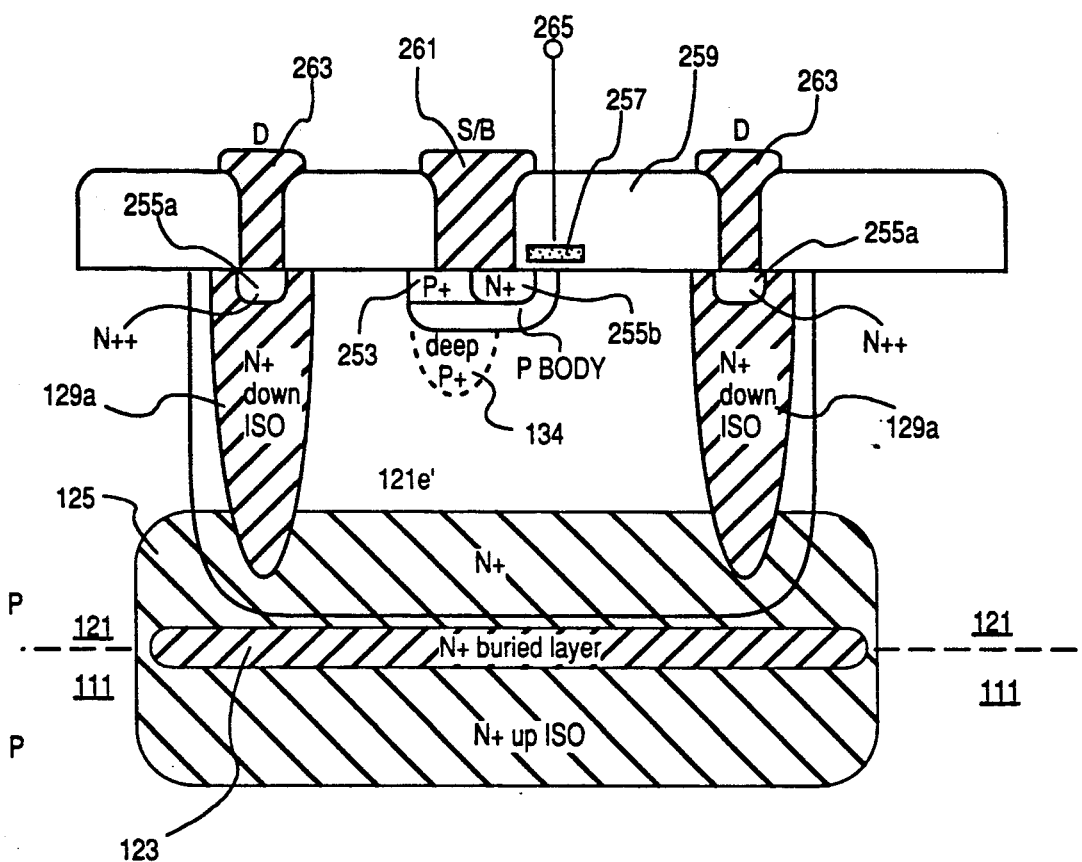
FIG. 24 is a schematic cross-sectional view of a high voltage lateral n-channel DMOS device having reduced drain resistance fabricated according to the invention.

A variety of process sequences and associated technologies are used to fabricate high voltage ICs. This disclosure describes a new process sequence that allows fabrication of a class of IC devices, with the initial process steps being substantially the same for each device in the class FIGS. 10 and 14-24 illustrate some members of one such class of devices. FIGS. 10 and 17 are cross sectional views of a high voltage, lateral p-channel DMOS transistor and a high voltage, vertical-lateral p-channel DMOS transistor, respectively. FIGS. 14 and 15 are cross sectional views of a high voltage bipolar pnp transistor and a high voltage npn transistor, respectively FIG. 16 is a cross section of a high voltage lateral drift drain n-channel DMOS device. FIGS. 18-22 are cross sectional views of a common body n-channel DMOS transistor, a common drain isolated p-channel DMOS transistor, an n-well PMOS transistor an NMOS transistor and a twin-tub or twin-well (p-tub and n-tub) CMOS device, respectively, all suitable for low voltage operation. FIGS. 23 and 24 are cross-sectional views of vertical-lateral and lateral n-channel transistors, respectively, each capable of high voltage operation. A variety of other transistors, as well as diodes, capacitors, resistors, silicon controlled rectifiers, IGBTs and other devices, may also be fabricated using the subject process sequence.

With reference to FIG. 10, an enclosed p− region 121e is bounded below by an n or n+ buried layer 123 (e.g., Sb or As of doping concentration $\approx 5 \times 10^{16}$–$10^{19}$ cm$^{-3}$) and on each of two or more sides by a substantially annular n+ up-isolation region 125 and a substantially annular down-isolation region 129 (doping concentration=$5 \times 10^{16}$ to $5 \times 10^{19}$ cm$^{-3}$) that overlap the buried layer 123 at the edges thereof. A heavily doped region will refer to one for which the doping concentration is substantially $5 \times 10^{16}$cm$^{-3}$ or greater; or for which the dose equivalent is substantially $10^{14}$cm$^{-2}$ or greater. Within the enclosed region 121e defined by the annular regions 125 and 129 and the buried layer 123, an annular $n_{body}$ region 155 is formed, and an annular p+ region 159a is formed as an island within the $n_{body}$ region. The lower portion 125 of the wrap-around isolation region is formed by up-diffusion (substantially annular) from a portion of a buried layer by a rapidly diffusing n dopant such as phosphorus; as this diffusion proceeds upward, the concentration profile also spreads laterally. The upper portion 129 of the wrap-around isolation region is formed by down-diffusion, from an exposed annular portion at the top surface of the epitaxial or covering layer 121, by a rapidly diffusing n dopant such as phosphorus as this diffusion proceeds downward, the concentration profile also spreads laterally Increasing the depth of the up-isolation region 125 and down-isolation region 129 will increase proportionately the width of the total region.

The enclosed region 121e defined by the buried layer 123, the up-isolation region 125 and down-isolation region 129, and the top surface of the epi layer 121 has wide and deep isolation regions 123, 125 and 129 of high n concentration; the enclosed region 121e can withstand a voltage differential with the outside world (remainder of the chip) of up to 600 volts. A parasitic pnp transistor 120, shown in dotted lines in FIG. 10, that may develop across the waist region formed at the intersection of the up-isolation and down-isolation regions 125 and 129 has an associated $\beta$ parameter for current gain of the order of 0.2. This might produce a peak current of 10 μA when the enclosed p-region 121e is forward-biased relative to the n+ buried layer 23 and n+ isolation regions 125 and 129, for a voltage differential of 250 volts across the buried layer 123 to the p-substrate 111; this is indicated by the dotted lines for the isolated p-epi region 121, and it produces a tolerable peak power level An optional ground voltage contact 169 may be included. FIG. 10 illustrates one embodiment of the CI process.

Figure 11:
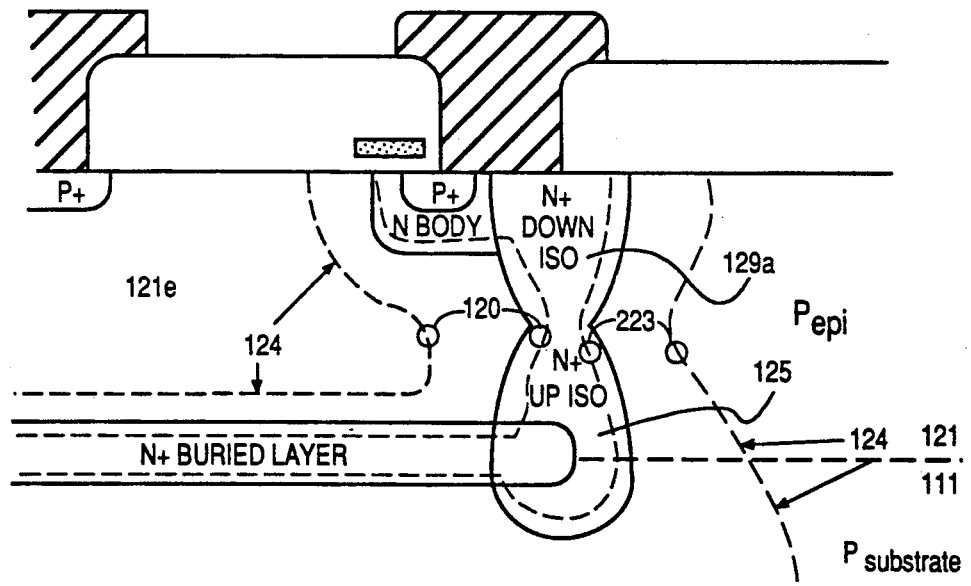
FIG. 11 is a schematic cross-sectional view of depletion spreading that may occur at an interface of an n+ wrap-around isolation region with a p− substrate region or with a p− epitaxial layer in a device fabricated in accordance with the invention.

A depletion region 124, illustrated in FIG. 11, may develop at each interface of an n+ and a p region, as shown by dotted lines for the enclosed region 121e. However, the width of the component of the depletion region located within the n+ or p− region is proportional to $N^{-k}$ (k=½ for abrupt junctions and k=1/3 for linear junctions), where N is a representative dopant concentration in that region; this width is thus much smaller (by one or more orders of magnitude) in the n+ region than in the p− region so that most of each of the n+ isolation regions 125 and 129 shown in FIG. 11 will survive as nondepleted, a consequence of the low parasitic pnp beta parameter of such regions. The p substrate 111 may be doped lighter than the p epitaxial layer 121.

The CI process used to fabricate a high voltage PMOS device as disclosed here is most closely related to the JI technique(s) discussed above, except that CI employs a p− epi-layer, rather than an n− epi layer, on a p substrate and utilizes the n+ isolation diffusion as both isolation region and sinker region simultaneously. The isolated high voltage PMOS device, combined with a self-isolated device arsenal fabricated in the p epi-layer material, allows straight-forward fabrication of low voltage logic devices and of high voltage NMOS and PMOS devices. Lateral npn parasitic transistors can develop in a high voltage NMOS device but are controlled by the large spacing between high voltage n+ isolation regions, by well placed p+ substrate contacts, and by the lower $\beta$ parameter (current gain) that is characteristic of lateral bipolar devices. In a high voltage PMOS device, as noted above, the $\beta$ parameter associated with a parasitic vertical pnp transistor is quite low ($\approx 0.2$) and is substantially independent of breakdown voltage.

Figure 12A:
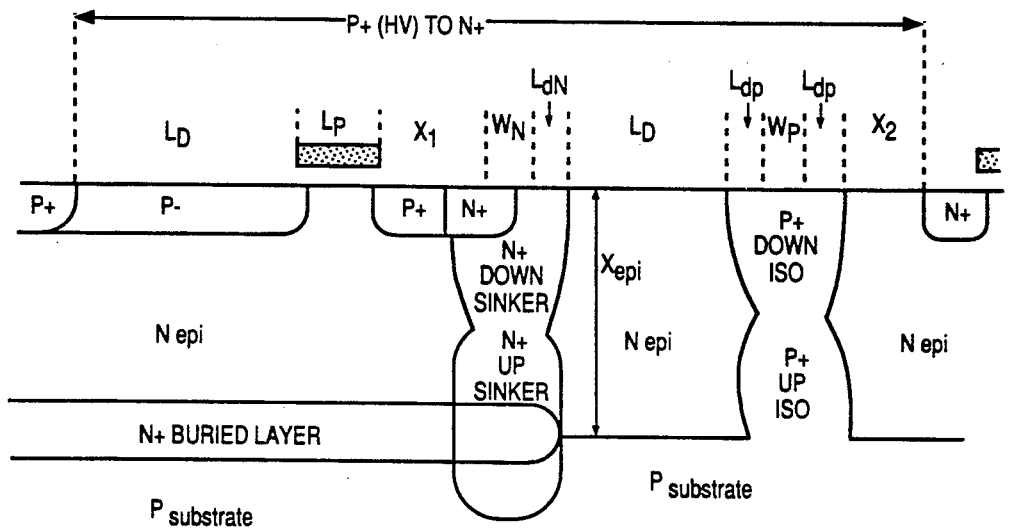
FIGS. 12A and 12B are schematic cross-sectional views comparing the spacing from the high voltage PMOS drain distribution to a low voltage n+ diffusion in (A) a JIC device fabricated in accordance with the invention and in (B) a CI device.
Figure 12B:
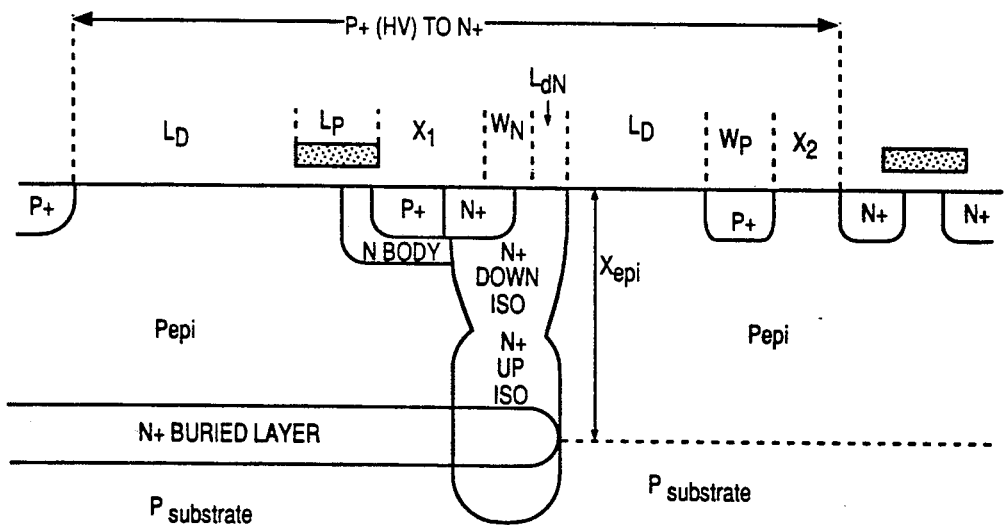

Comparison of packing densities of a high voltage PMOS device for JIC and CI processes provides another means by which to compare efficiencies of the competing technologies. In the structures shown in FIGS. 12A (using JIC) and 12B (using CI), the length $L_D$ is assumed to be the ideal drift length (substantially 25 $\mu$m) required to support voltage breakdown (chosen as 250V for this example), $X_{epi}$ is the epi layer thickness (chosen as 30 $\mu$m to provide 250V breakdown voltage from the p+ drain to the n+ buried layer in either structure), $L_P$ is a 5 $\mu$m polysilicon gate length, $X_1$ is a deep n+ region-to-polysilicon spacing of 20 $\mu$m to avoid variations in $V_T$, $W_n$ is the deep n+ minimum width to prevent pnp action (substantially 20 $\mu$m), $L_{dn} \approx X_{epi}/2$ to guarantee up/down n+ overlap, $W_p$ is the minimum p+ width of 5 $\mu$m, $L_{dp} \approx X_{epi}/2$, and $X_2$ is the minimum space of n+ to p+ for 20V breakdown (typically 5 $\mu$m). Given these factors, the high voltage p+ to low voltage n+ space required for the JIC process is determined by $$X_{JIC} = 2L_D + L_p + W_n + L_{dn} + X_1 + W_p + 2L_{dp} + X_2 \geq$$
$$50 + 5 + 20 + 15 + 20 + 5 + 30 + 5 = 150 \mu m;$$

and for the CI process this becomes $$X_{CI} = 2L_D + L_P + W_n + L_{dn} + X_1 + W_p + X_2 \geq$$
$$50 + 5 + 20 + 15 + 20 + 5 + 5 = 120 \mu m.$$

The CI process thus yields a savings of at least 30 $\mu$m in required separation. In practice, however, the p+ isolation width is typically >5 $\mu$m and is used numerous times in an HVIC, resulting in larger chip areas with the use of JIC.

Figure 13:
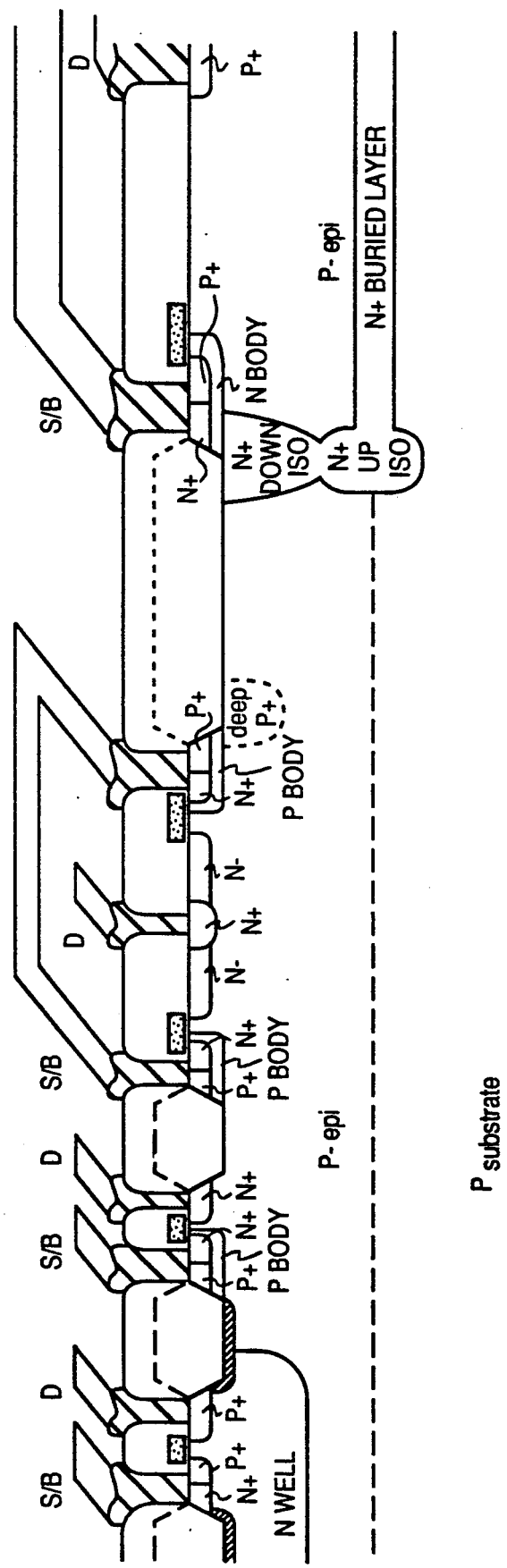
FIG. 13 is a schematic cross-sectional view of several monolithically integrated complementary-isolated D/CMOS devices according to the invention including low voltage CMOS, high voltage LDD n-channel lateral DMOS and high voltage isolated p-channel lateral DMOS devices.

The proposed process, CI, and its device arsenal, as illustrated in FIG. 13, is simpler and produces a denser array than does a conventional junction-isolation but does not require the elaborate processing steps used by the dielectrically isolated process (DI). Furthermore, the CI process is capable of producing a full range of parasitic-free complementary devices, including low voltage CMOS, high voltage CMOS up to 600V with n+ up-/mid-/down- isolation regions, or up to 250V with up-isolation and down-isolation regions, complementary, fully isolated bipolar transistors (pnp, shown in FIG. 14, and npn shown in FIG. 15) as well as numerous passive elements.

The high voltage n-channel LDMOS device 101 with lightly doped drain, high voltage p-channel LDMOS device 103, low voltage n-channel LDMOS device 105 and low voltage PMOS device 107 shown in FIG. 13, and structural variations of these devices that can be monolithically integrated using the CI process, are discussed in the Description that follows.

The npn bipolar transistor shown in FIG. 15 and implemented in CI uses an n-well as the collector and is therefore naturally isolated from other devices. A contact 162 for the n-well collector may be provided by an n+ diffusion at the top surface of a down-isolation region 129. The collector resistance can be substantially reduced by the use of the n+ down-isolation region 129 as a sinker region surrounding the device and by the use of a combination of an n+ up-isolation region 125 and n+ buried layer 123 completely extending beneath the n-well collector. In FIG. 15, the n+ up-isolation region 125 surrounds the n+ buried layer 123. Optionally, in this configuration, one might delete the buried layer 123 or delete the up-isolation region 125. However, if both are included the resulting isolation is improved. This is also true for the isolation regions shown in FIGS. 22, 23 and 24 and discussed below. $V_{ce}$ (sat) voltages and collector resistance can therefore be reduced to extremely low values A $p_{body}$ region 152, used for an n-channel DMOS device, is (also) employed as the base of a bipolar transistor; and an n+ region 166, used as the source of the n-channel DMOS device, is (also) employed as the emitter. The base 171c is contacted by an annular p+ region 158, which also serves to prevent surface inversion across the base; the p+ contact region 158 may, but need not, touch the n+ emitter 166 on the emitter sides. Optimization of the emitter/base profile is precluded by the necessity for these diffusion regions to function as the source and body regions of the high voltage n-channel lateral DMOS device previously described Nevertheless, the CI process is capable of monolithically integrating both fully-isolated vertical npn and pnp bipolar transistors.

The pnp bipolar transistor implemented in CI in FIG. 14 uses the isolated region 121e enclosed by the n+ up-isolation region 125 and down-isolation region 129a and buried layer 123 as the collector; hence, the device is fully isolated The collector is contacted by a shallow p+ region 160b or by a deep diffused p+ region 134. The $n_{body}$ region 154 used for a p-channel DMOS device is employed as part of the base of a bipolar transistor; and a p+ region 160a transistor (EBC) shown in FIG. 14, used as the source of the p-channel DMOS device, acts as the emitter. The transistor base is contacted by an annular n+ region 164, which also serves to prevent surface inversion across the base 154; the n+ region 164 may, but need not, touch the sides of the p+ emitter 160. Optimization of the emitter/base profile is precluded by the necessity for these diffusion regions to function as the source and body region of the high voltage p-channel lateral DMOS device previously described.

Figure 25A:
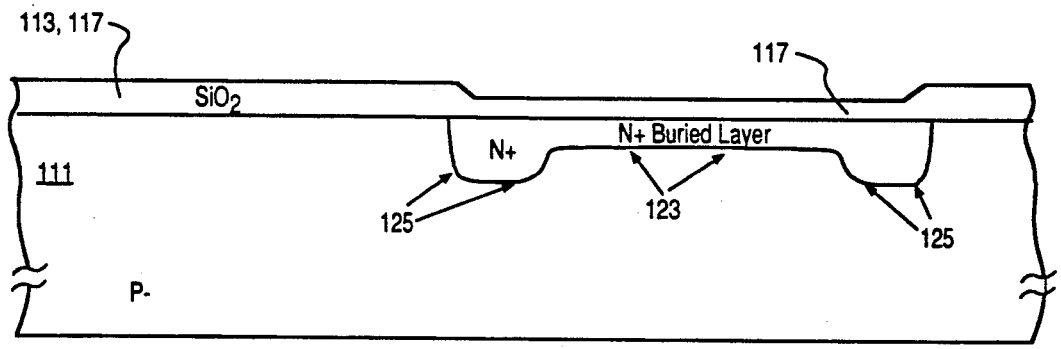
FIGS. 25A-25P are schematic cross-sectional views illustrating groups of consecutive fabrication steps according to embodiments of the invention.
Figure 25B:
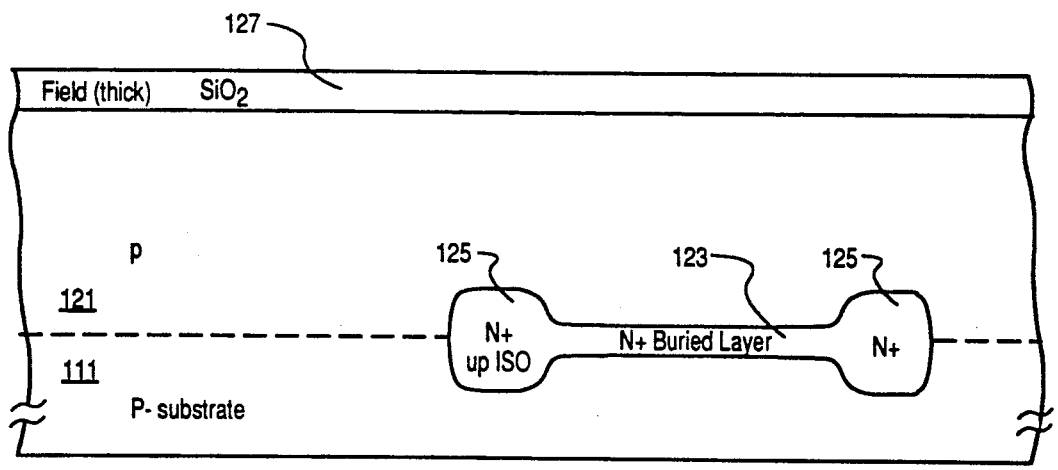
Figure 25C:
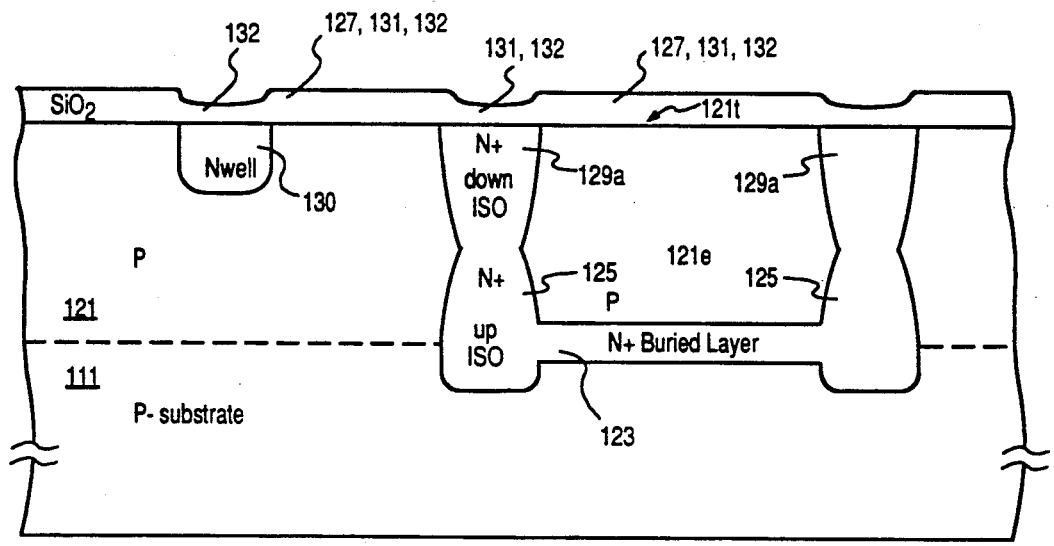
Figure 25D:
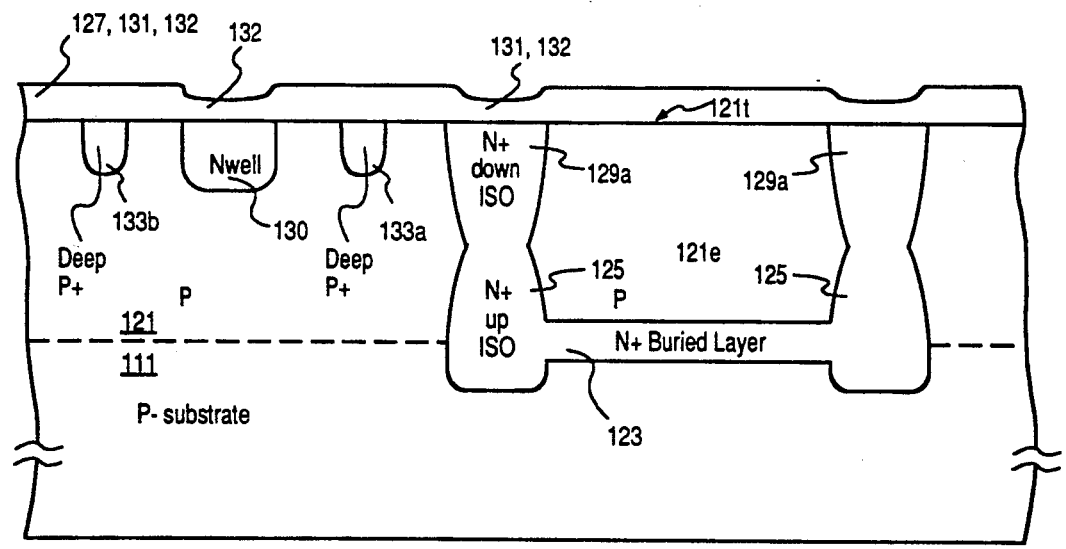
Figure 25E:
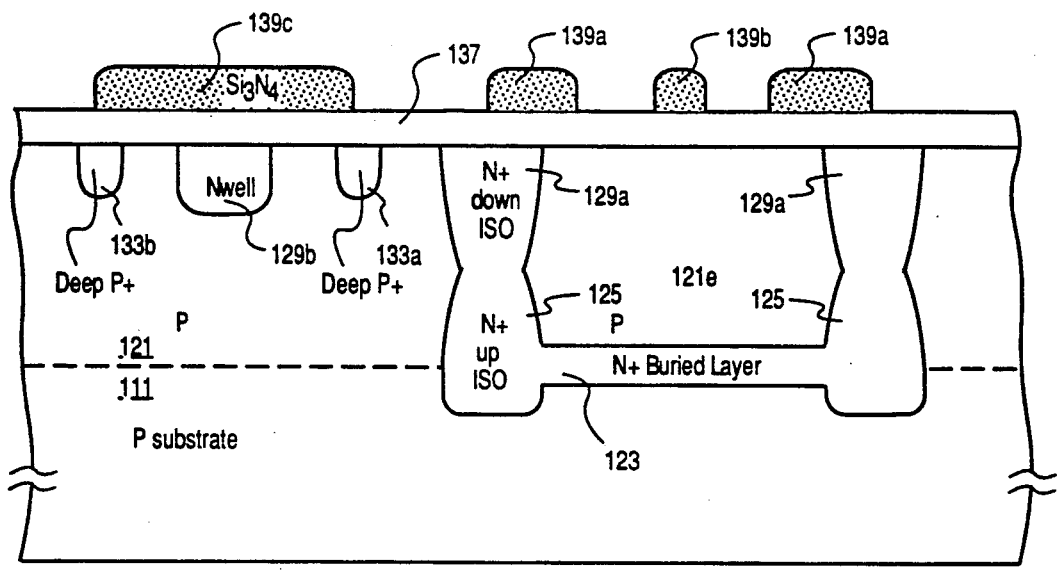
Figure 25F:
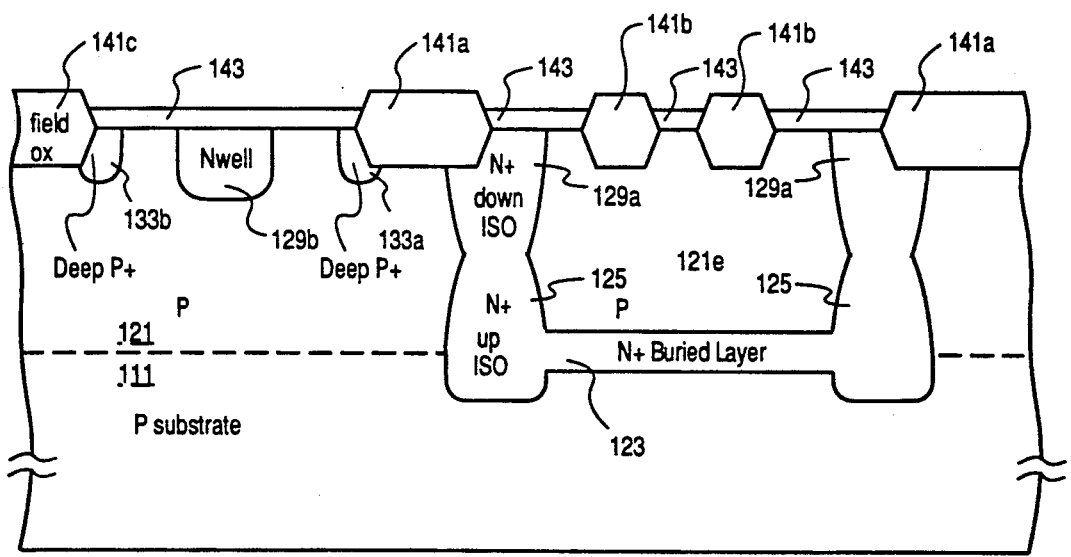
Figure 25G:
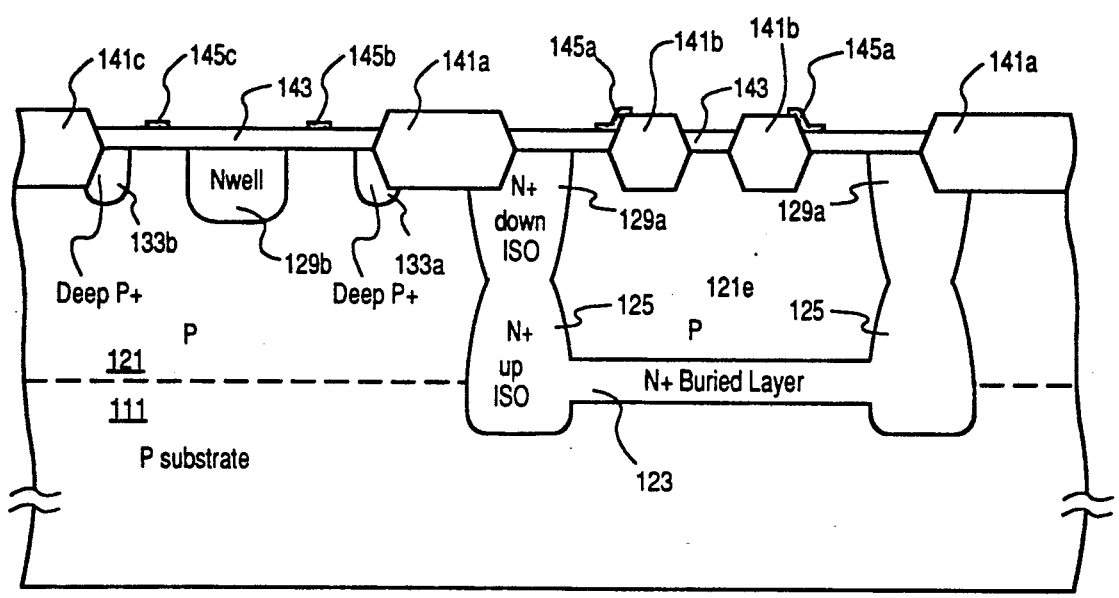
Figure 25H:
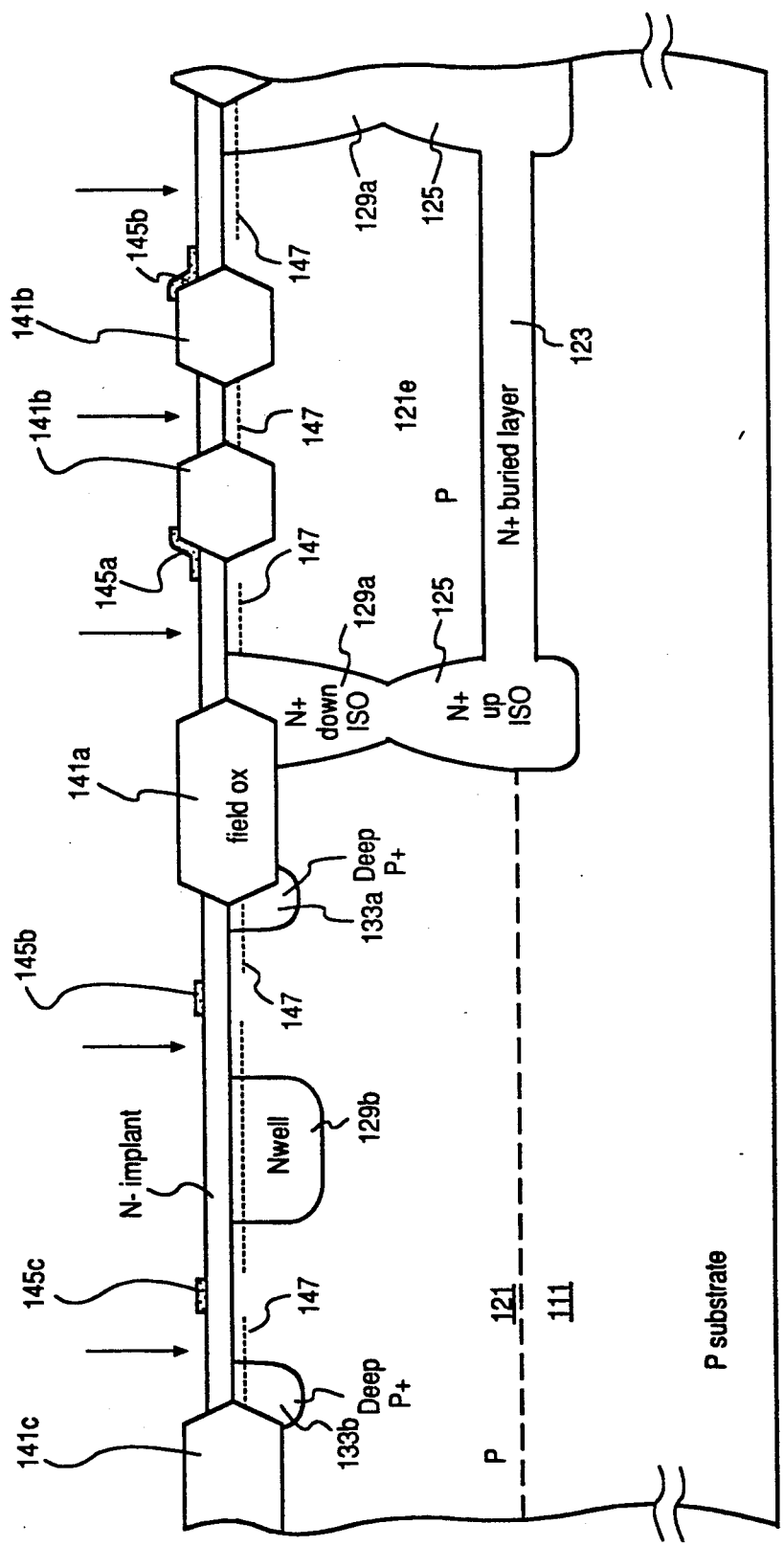
Figure 25I:
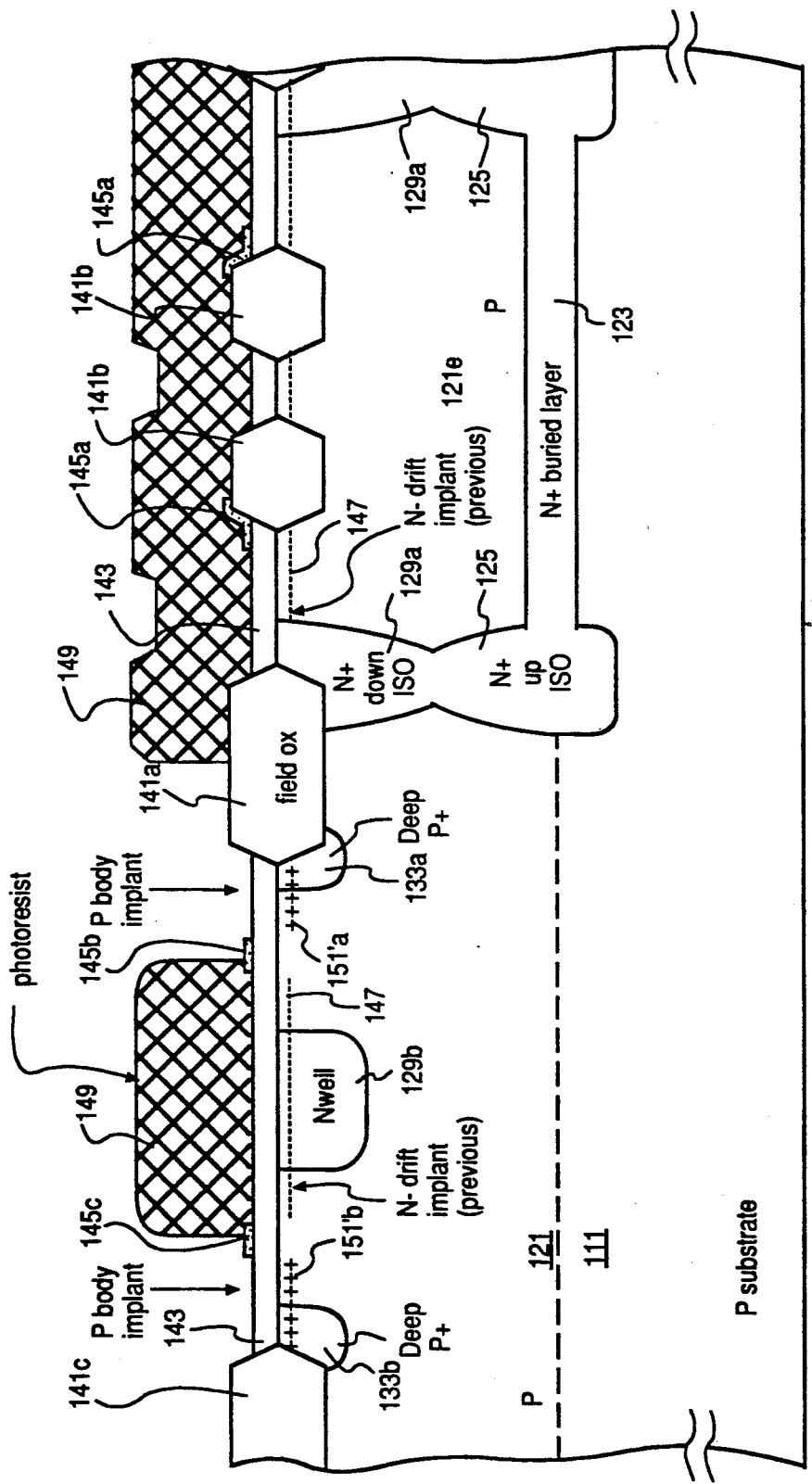
Figure 25J:
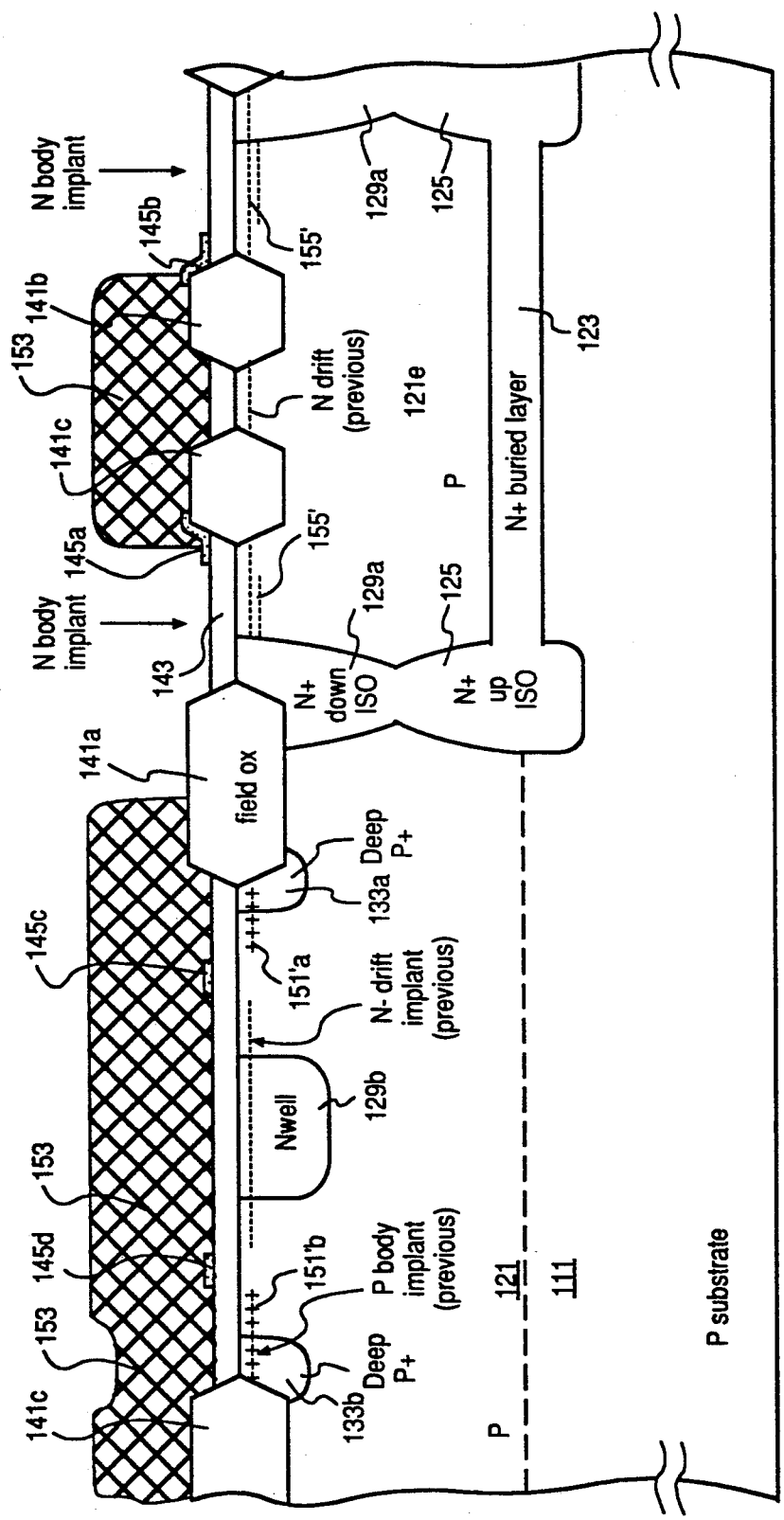
Figure 25K:
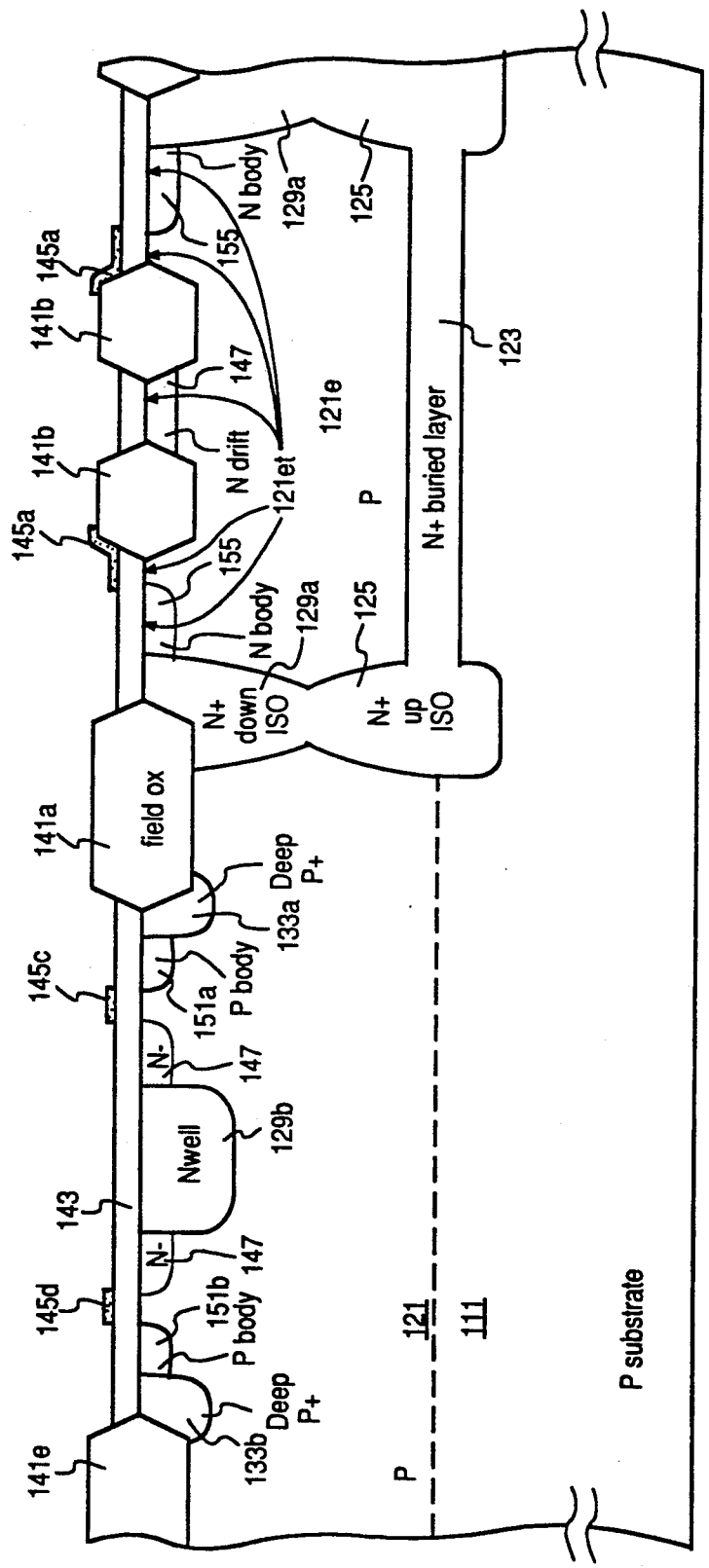
Figure 25L:
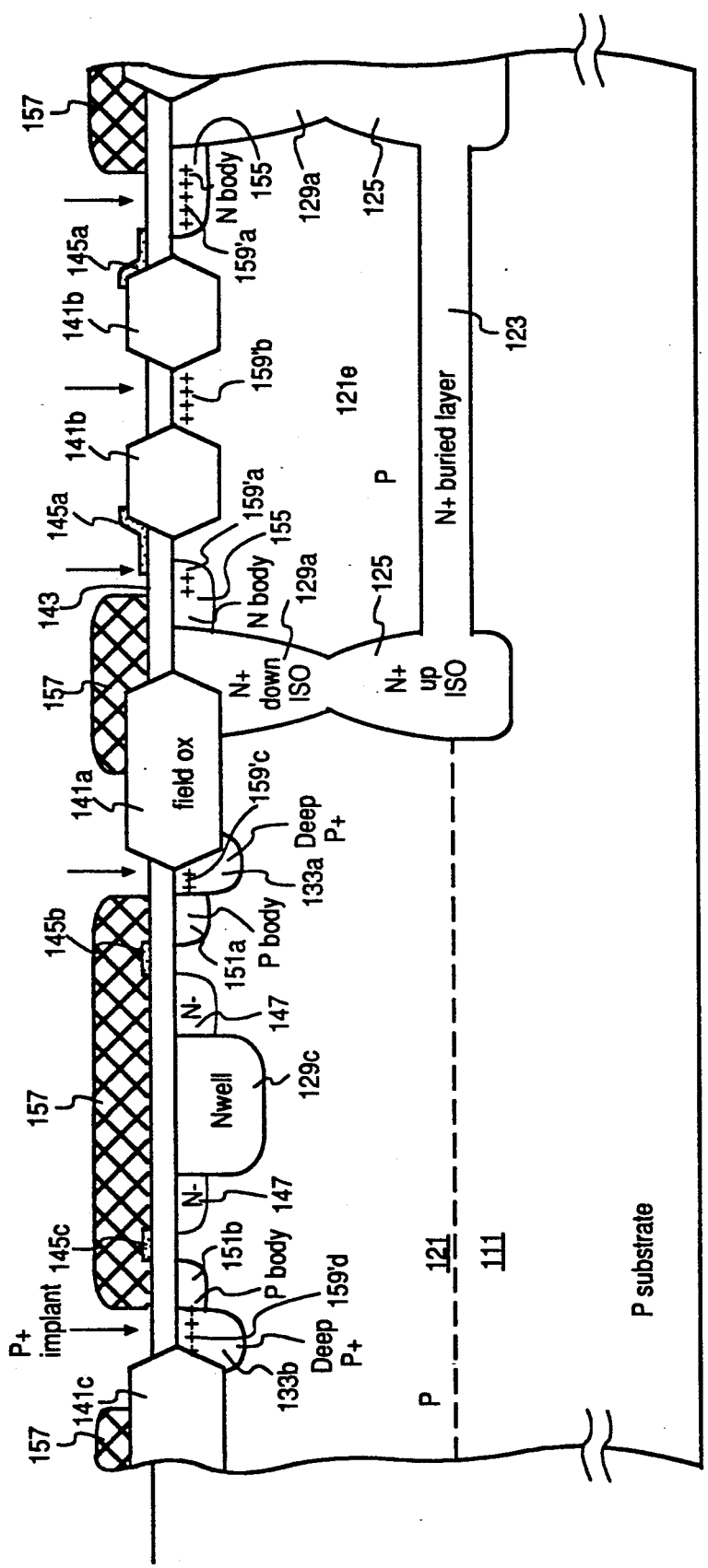
Figure 25M:
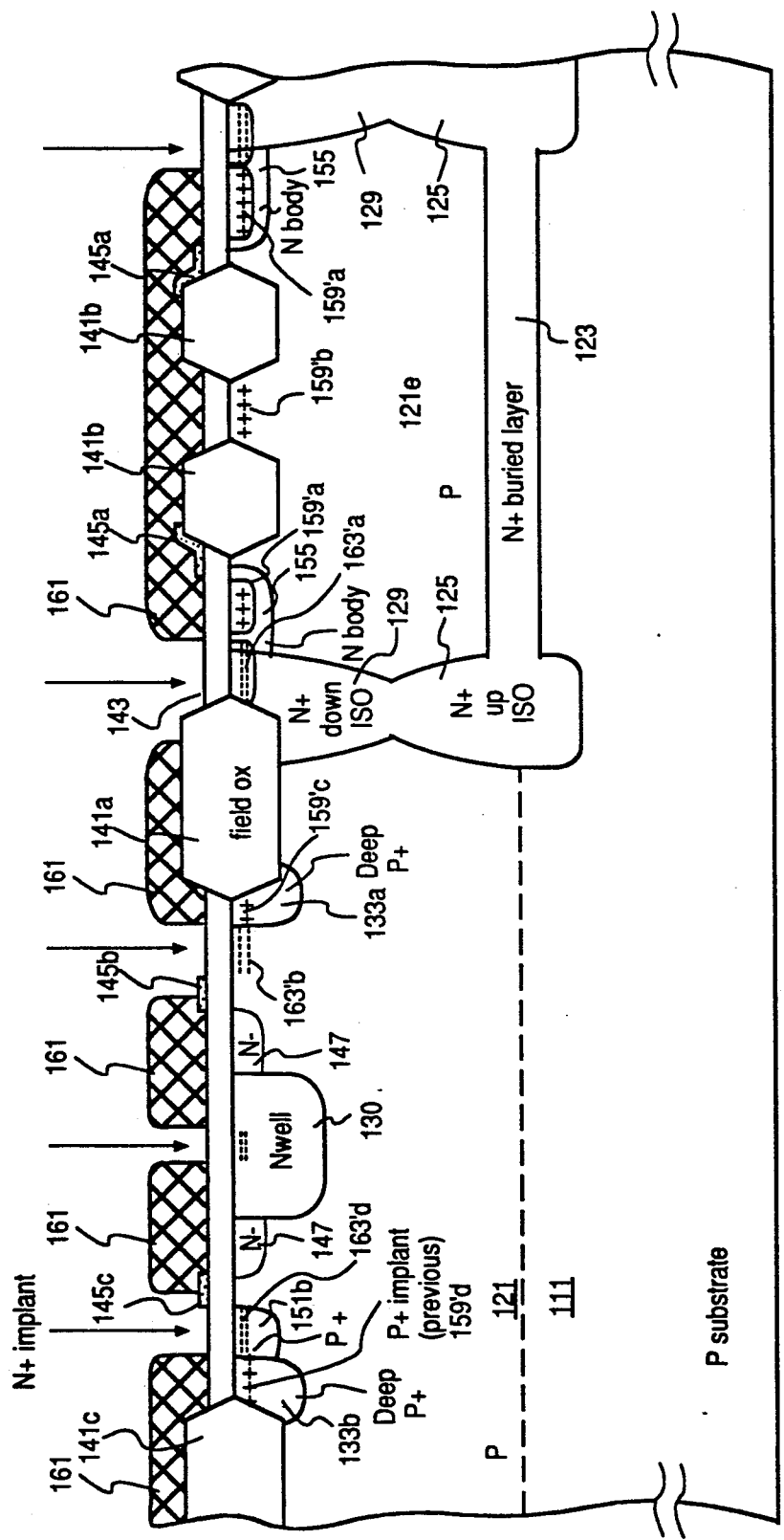
Figure 25N:
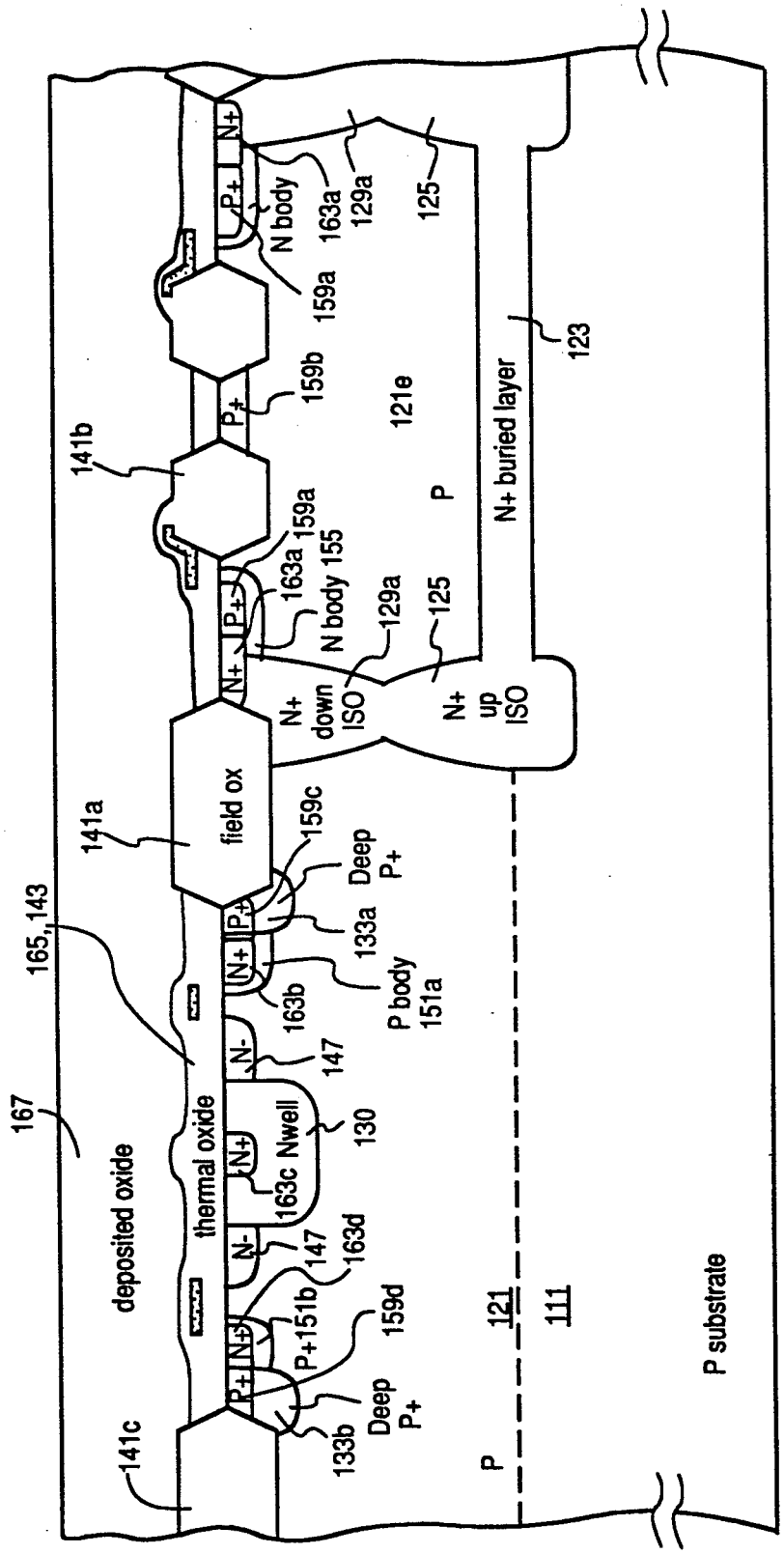
Figure 25O:
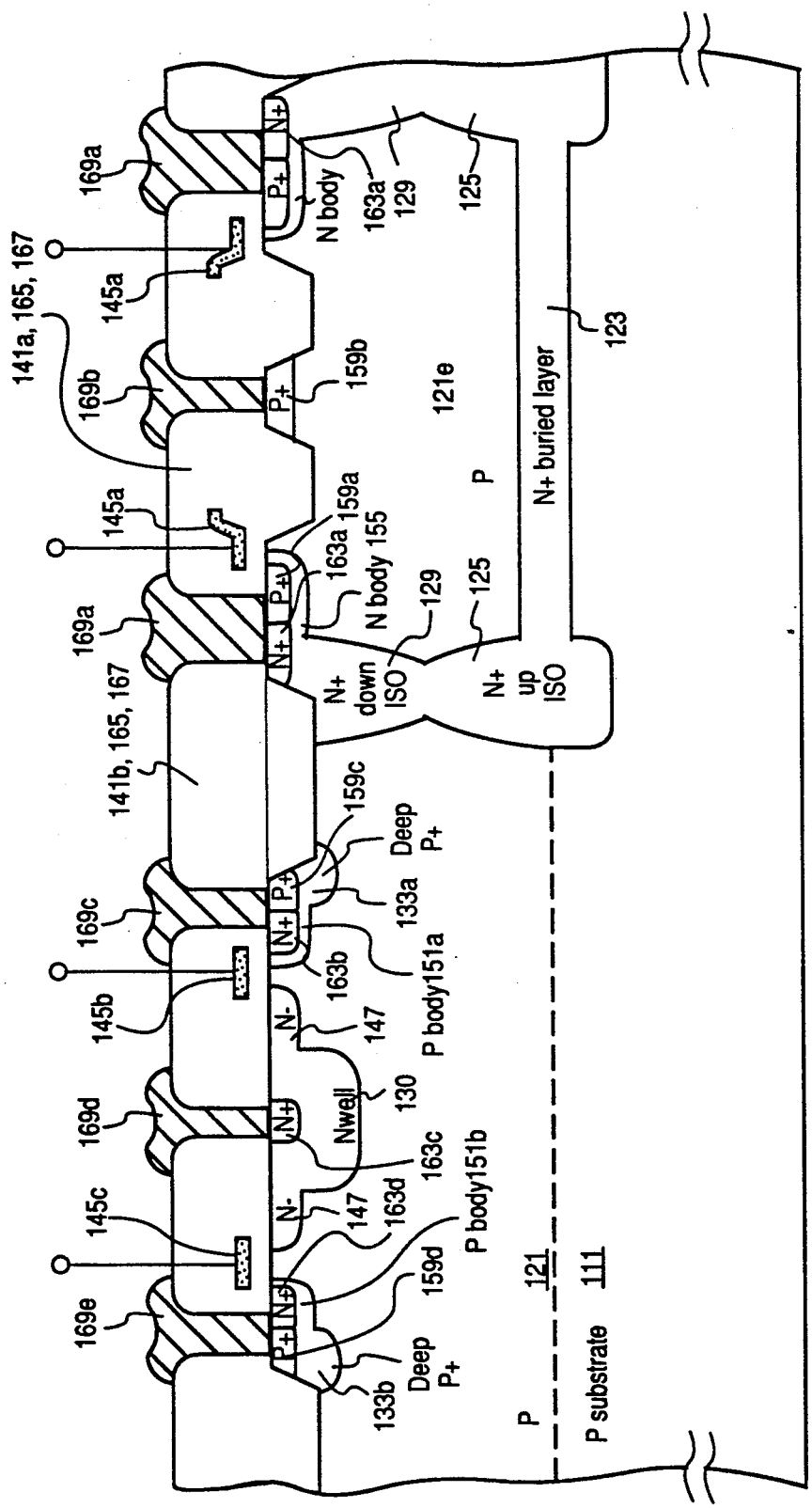

FIGS. 25A-25O exhibit a sequence of 15 groups of process steps according to one embodiment of the invention; fabrication of any one of the class of devices discussed here does not necessarily require use of all 15 groups. In FIG. 25A, one begins with a lightly doped, p type Si or other semiconductor substrate 111 (doped to resistivity substantially 10-60 Ohm-cm) and carries out the following steps: (a1). grow an initial oxide layer 113 of thickness substantially 0.4-1 $\mu$m, using steam or some other suitable oxygen-carrying medium at temperatures substantially T=1,000-1,200° C.; (a2) etch a first aperture in a portion of the first oxide layer 113 to expose a portion of the upper surface of the substrate 111; (a3) deposit, by predeposition, ion implantation or otherwise, an n type dopant (n+) that is slowly diffusing in the semiconductor material (for example, Sb or As) in a thin layer at the exposed upper surface of the substrate 111 with an equivalent dose of substantially $10^{14}$–$10^{16}$ cm$^{-2}$ and allow this dopant to slowly diffuse downward into the substrate 111 from the upper surface thereof to form part of a first dopant profile 123; as a first alternative for this step, one can implant the n+ dopant in a thin layer at the exposed portion of the upper surface of the substrate 111, using Sb or As ions of initial kinetic energy less than 100 Kev, and allow the slow diffusion to proceed; as a second alternative for this step, one can deposit a first photoresist layer on the first oxide layer 113, using a mask to define the desired aperture, and etch the aperture and use ion implants of the dopant Sb or As at kinetic energies less than 100 Kev to provide an equivalent dose of substantially $\phi=10^{14}-10^{16}$ cm$^{-2}$, and allow the slow diffusion to proceed as before; each of these three alternatives (aperture etch plus predeposition, aperture etch plus ion implant, photoresist plus mask etch plus ion implant) can be used in the following process steps wherever a shallow layer of dopant (of depth no more than 1-3 μm) is called for; (a4) perform drive-in of the slowly diffusing dopant at a temperature of substantially $T=1100-1250°$ C. for a time interval of substantially $\Delta t=2-4$ hours, to produce part of a first dopant profile 123 adjacent to the top surface of the substrate 111 and of depth substantially 1-5 μm; (a5) provide a second oxide layer 117 at the upper surface of the structure, and form one or more second apertures in this oxide layer to expose a portion of the top surface of the substrate 111, the exposed portion being contiguous to and laterally surrounding the portion of the top surface at which the first (slowly diffusing) dopant was deposited; (a6) provide a second dopant of n type (n+) in a thin layer at the exposed portion of the substrate top surface corresponding to a dose of substantially $\phi=10^{14}-10^{16}$ cm$^{-2}$, where the dopant is relatively rapidly diffusing in the semiconductor material (for example, phosphorus); and (a7) perform drive-in of the rapidly diffusing second dopant into the top surface of the substrate at a temperature of substantially $T=1100-1200°$ C. for a time interval of substantially $\Delta t=30-300$ minutes, to produce part of a second dopant profile 125 of depth substantially 1-5 μm; where this part of the second dopant profile 125 preferably forms an annular region that laterally surrounds the part of the first dopant profile 125 in the substrate material.

With reference to the process steps indicated in FIG. 25B, one: (b1) strips the first and second oxide layers 113 and 117; (b2) deposits a p type covering layer 121, which may be epitaxial and may have associated resistivity of substantially 10-60 Ohm-cm, of layer thickness substantially 20-50 μm on the exposed top surface of the substrate; (b3) allows the slowly diffusing first dopant to diffuse upward into the covering layer 121 to produce another part of the first dopant profile 123 in the covering layer, where the first dopant profile defines a buried layer n+ of total thickness 2-4 μm as shown; (b4) allows the rapidly diffusing second dopant to diffuse upward into the covering layer 121 to provide another part of the second dopant profile (n+), where the second dopant profile defines an up-isolation region 125 (preferably substantially annular in shape) in the covering layer that extends from the bottom of the covering layer 121 upward through a substantial portion of the thickness of the covering layer as shown; and (b5) provides a third oxide layer 127 at the top surface of the covering layer, where the third oxide layer is of thickness substantially 0.4-1 μm and is grown using steam or other suitable oxygen-carrying medium at a temperature of substantially $T=1000-1200°$ C.

With reference to FIG. 25C, one: (c1) provides a third aperture in the third oxide layer 127 to expose a portion of the top surface of the covering layer 121, where the third aperture is substantially annular and overlies the second dopant profile and corresponding up-isolation region 125; (c2) provides a thin layer of n dopant that is rapidly diffusing in the semiconductor material (for example, phosphorus) of equivalent dose substantially $\phi=10^{15}-10^{16}$ cm$^{-2}$ at the exposed portion of the top surface 121t of the covering layer 121; (c3) performs drive-in of this rapidly diffusing dopant into the covering layer 121, using a temperature of substantially $T=1100-1200°$ C. for a time interval of substantially $\Delta t=30-300$ minutes, in order to drive the rapidly diffusing dopant vertically downward into the covering layer 121 from the top surface 121t thereof so that the downward diffusing dopant forms a third dopant profile and associated annular down-isolation region 129a that meets and merges with the up-isolation region 125; (c4) provides a fourth oxide layer 131 at the upper surface of the structure, of thickness substantially 0.2-1 μm, grown using steam or other suitable oxygen-carrying medium at a temperature of substantially $T=1000-1200°$ C.; (c5) provides a fourth aperture in the oxide layer 131 to expose a portion of the top surface of the covering layer 121 that is spaced apart from and is not laterally surrounded by the third dopant profile 129a; (c6) provides a layer of n dopant that is rapidly diffusing in the semiconductor material (for example, phosphorus) of equivalent dose substantially $\phi=8\times10^{11}-10^{13}$ cm$^{-2}$ at the exposed portion of the top surface 121t of the covering layer 121; (c7) performs drive-in of this rapidly diffusing dopant into the covering layer 121, using a temperature of substantially $T=1100-1200°$ C. for a time interval of substantially $\Delta t=5-20$ hours, in order to drive this dopant vertically downward to form a fourth dopant profile and associated n− well 130 that extends downward from a portion of the top surface 121t of the covering layer 121; and (c8) deposits a fifth oxide layer 132 of thickness substantially 0.4-0.8 μm over the upper surface of the structure. The buried layer 123, the up-isolation region 125, the down-isolation region 129a, and the top surface 121t of the covering layer 121 together enclose and define an enclosed (and electrically isolatable) region 121e of the covering layer.

With reference to FIG. 25D, one: (d1) provides fifth and sixth apertures in the fifth oxide layer 132 to expose two portions of the top surface 121t of the covering layer 121, with the first exposed portion being spaced apart from and positioned between the down-isolation region 129a and the n-well 130, and with the second exposed portion being spaced apart from the n-well 130 and positioned on the opposite side of the n-well 130 so that this n-well lies between these two exposed portions of the top surface 121t of the covering layer 121; (d2) provides p type dopant at the top surface 121t of the covering layer 121 at the first and second exposed portions thereof, where the dopant has an equivalent dose of substantially $\phi=10^{14}-10^{16}$ cm$^{-2}$; and (d3) performs drive-in of the p+ dopant at these two layers at a temperature of substantially $T=900-1150°$ C. for a time interval of substantially $\Delta t=30-300$ minutes to produce first and second deep p+ regions 133a and 133b of depth substantially 2-8 μm. Alternatively, the deep p+ regions may be joined together as an annulus.

With reference to FIG. 25E, one: (e1) strips the third, fourth and fifth oxide layers 127, 131 and 132 from the entire top surface of the covering layer 121; (e2) provides a thin sixth oxidized layer 137, primarily for stress relief, of thickness substantially 0.05-0.1 μm on the top surface 121t of the covering layer 121, using a temperature of substantially T=900-1100° C. for a time interval of substantially Δt=30-60 minutes in an oxygen-rich atmosphere; (e3) deposits, by suitable chemical vapor deposition techniques and masking and etching, silicon nitride (nominally $Si_3N_4H_x$) over three portions of the sixth oxide layer 137, with a first portion of the silicon nitride 139a overlying a portion of the down-isolation region 129 and a portion of the enclosed region 121e of the covering layer 121, with a second portion 139b of the silicon nitride being positioned over a portion of the enclosed region 121e and being spaced apart from the first portion 139a, and with a third portion 139c of the silicon nitride being positioned over a portion of each of the first and second deep p+ regions 133a and 133b and the n-well 130 and being positioned over all portions of the top surface 121t of the covering layer 121 that lie between the two deep p+ regions 133a and 133b; the silicon nitride 139a, 139b and 139c preferably has a thickness of substantially 0.7-2 μm.

With reference to FIG. 25F, one: (f1) grows three thick field oxide regions 141a, 141b and 141c of thickness at least 1-2 μm over the exposed portions of the fifth oxide layer 137, using wet oxide at a temperature of substantially T=900-1100° C.; where the first field oxide region 141a laterally surrounds and overlaps an uppermost portion of the down-isolation region 129 and extends above the sixth oxide layer 137 and is annular in shape; the second field oxide region 141b is also annular in shape, is spaced apart from the down-isolation region 129, is positioned overlying a portion of the enclosed region 121e of the covering layer 121 and extends downward into the enclosed region 121e and upward above the sixth oxide layer 137; and the third field oxide region 141c overlies a portion of the second deep p+ region 133b and extends downward into this deep p+ region and extends upward above the sixth oxide layer 137; (f2) strips the silicon nitride 139a, 139b and 139c and the underlying sixth oxide layer 137, using plasma or a wet etch of phosphoric acid or other suitable etchant, to expose the top surface 121t of the covering layer 121, except where the field oxide regions 141a, 141b and 141c extend above this surface; and (f3) provides a seventh oxide layer 143 that will serve as a gate oxide over the upper surface of the structure, where the gate oxide region may have thickness 0.02-0.25 μm and is formed using a dry oxygen-containing atmosphere at a temperature of substantially T=800-1100° C. The oxide may be grown in an ambient atmosphere containing a chlorine source such as trichloroethane. Alternatively, this gate oxide may be chemically stripped and grown again to insure that all nitride has been removed.

With reference to FIG. 25G, one: (g1) deposits and dopes and subsequently patterns polysilicon or another suitable material of resistivity substantially 25-50 Ohms/square at three positions on the upper surface of the gate oxide 143 to define three gate regions, with the first gate region 145a being annular in shape and being contiguous to and laterally surrounding the second field oxide region 141b at a position overlying a portion of the enclosed region 121e of the covering layer 121 and being spaced apart from a region that overlies the down-isolation region 129, with a second gate region 145b overlying a region that is spaced apart from and lies between the n-well 129b and the first deep p+ region 133a, and with the third gate region 145c overlying a region that is spaced apart from and lies between the n-well 130 and the second deep p+ region 133b.

The two gate regions 145b and 145c may be linear or may be joined together as part of an annulus.

With reference to FIG. 25H, one: (h1) provides a blanket drift region 147 (n−) (a sixth dopant profile) by ion implant through the seventh oxide layer 143 into a shallow region at the top surface 121t of the covering layer 121 and enclosed region 121e, using the field oxide regions 141a, 141b and 141c and the gate regions 145a, 145b and 145c as masks therefor, where the implant of n type material has an equivalent dose of substantially $\phi = 5 \times 10^{11} - 5 \times 10^{13}$ cm$^{-2}$. The n− drift region 147 appears adjacent to the top surface 121t of the covering layer 121 at all positions not directly covered by a field oxide region (141a,b,c) or a gate region (145a,b,c).

With reference to FIG. 25I, one: (i1) provides, by suitable masking, a first intermediate photoresist layer 149 that covers (i) a portion of each of the second and third gate regions 145b and 145c and the upper surface of the structure therebetween and (ii) a portion of the first field oxide region 141a and all of the upper surface of the structure that is laterally surrounded by the first field oxide region; (i2) uses ion implantation of p type material to provide $p_{body}$ implant regions (p−) 151'a and 151'b adjacent to and within the top surface 121t of the covering layer 121 at positions adjacent to the second and third gate regions 145b and 145c and not covered by one of the field oxide regions (141a,b,c), by the second and third gate regions 145b or 145c, or by the first intermediate photoresist layer 149; the ion implant dose here is substantially $\phi = 10^{13} - 5 \times 10^{14}$ cm$^{-2}$; and (i3) strips the first intermediate photoresist layer 149 from the upper surface of the structure.

With reference to FIG. 25J, one: (j1) provides a second intermediate photoresist layer 153 over two portions of the upper surface of the structure to cover (i) a portion of the first field oxide region 141a and all portions of the structure not overlying any portion of the enclosed region 121e of the covering layer 121 or of the down-isolation region 129 and (ii) a portion of the first gate region 145a and all portions of the structure that are laterally surrounded by the first gate region 145a, using suitable masking; (j2) uses ion implantation of n type dopant at the exposed portions of the top surface 121et of the enclosed region 121e of the covering layer 121 to produce an $n_{body}$ implant region 155' (n−) that forms an annular region that is adjacent to and is laterally surrounded by the down-isolation region 129, where the ion implantation dose is substantially $\phi = 10^{13} - 5 \times 10^{14}$ cm$^{-2}$; and (j3) strips the second intermediate photoresist layer 153 from the upper surface of the structure.

With reference to FIG. 25K, one: (k1) performs drive-in at the upper surface of the structure, using a temperature of substantially T=1100-1250° C. for a time interval of substantially $\phi t = 3-12$ hours to convert the $p_{body}$ implant regions 151'a and 151'b to $p_{body}$ regions 151a and 151b, respectively, and to convert the annular $n_{body}$ implant region 155' to an annular $n_{body}$ region 155, where the $p_{body}$ regions 151a and 151b (seventh dopant profiles) and the $n_{body}$ region 155 (eighth dopant profile) have depths of approximately 3 μm and the remainder of the n-drift region 147 has a depth of approximately 1.5 μm as a result of this drive-in process. The $p_{body}$ regions 151a and 151b may be linear or may be joined together in an annulus.

With reference to FIG. 25L, one: (l1) deposits a third intermediate photoresist layer 157 over the top surface of the structure and exposes, by suitable masking, (i) a first portion of the $n_{body}$ region 155 adjacent to the first gate region 145a and the remainder of the top surface 121et of the enclosed region 121e that is laterally surrounded by that $n_{body}$ region, (ii) a portion of the first field oxide region 141a and the portion of the seventh oxide layer 143 that overlies the first deep body region 133a and (iii) a portion of the third field oxide region 141c and the portion of the seventh oxide layer 143 that overlies the second deep p+ region 133b; (12) uses ion implantation of p type dopant (for example, boron) of dose substantially $\phi = 10^{14}-10^{16}$ cm$^{-2}$ to establish heavily doped p+ implant regions in the upper part of the first portion of the $n_{body}$ region 155 (159'a), in a region at the top surface 121et of the enclosed region 121e that is laterally surrounded by the second field oxide region 141b (159'b), at a top portion of the first deep p+ region 133a (159'c) and at a top portion of the second deep p+ region 133b (159'd); and (13) strips the third intermediate photoresist layer 157 from the upper surface of the structure.

With reference to FIG. 25M, one: (m1) deposits a fourth intermediate photoresist layer 161 on the upper surface of the structure and provide apertures therein by suitable masking to expose (i) an annular region overlying the down-isolation region 129 and a portion of the $n_{body}$ region 155 that is contiguous to the down-isolation region 129, (ii) a portion of the second gate region 145b and the portion of the seventh oxide layer 143 that lies between the second gate region 145b and the first deep p+ region 133a, (iii) a portion of the n-well 130 and (iv) a portion of the third gate region 145c and the portion of the seventh oxide layer 143 that lies between the third gate region 145c and the second deep p+ region 133b; (m2) uses ion implantation of n type dopant (for example, phosphorus or arsenic) to establish n+ implant regions 163'a, 163'b, 163'c and 163'd in a shallow region adjacent to the exposed portions of the top surface 121t of the covering layer 121 and the enclosed region 121e, using an effective n type ion dose of substantially $10^{15}-10^{16}$ cm$^{-2}$ for the dopant; and (m3) removes the fourth intermediate photoresist layer 161 from the upper surface of the structure.

With reference to FIG. 25N, one: (n1) performs drive-in of the p+ implant regions 159'a,b,c and d and of the n+ implant regions 163'a,b,c and d, using temperatures of substantially T=1000-1100° C. for time intervals of substantially $\Delta t = 30$-90 minutes, to produce p+ regions 159a,b,c and d (ninth dopant profiles) and n+ regions 163a,b,c and d (tenth dopant profiles) of depth substantially 0.5-2 μm adjacent to the top surface 121t of the covering layer 121 and of the enclosed region 121e that are enclosed within the respective $P_{body}$ and $n_{body}$ regions; (n2) grows an eighth (thermal) oxide layer 165 over the upper surface of the structure of thickness substantially 0.1-0.4 μm; and (n3) deposits a ninth oxide layer 167 by CVD or other appropriate processes of thickness 0.5-4 μm over the eighth oxide layer 165.

With reference to FIG. 25O, one (o1) etches five apertures through the seventh, eighth and ninth oxide layers 143, 165 and 167 to expose (i) a portion of each of the annular p+ and n+ regions 159a and 163a, (ii) a portion of the second p+ region 159b, (iii) a portion of each of the third p+ region 159c and the second n+ region 163b, (iv) a portion of the third n+ region 163c and (v) a portion of each of the fourth p+ region 159d and the n+ region 163d; (o2) provides a metal or other electrically conducting material (for example, Al/Si) in each of these five apertures to form electrodes 169a, 169b, 169c, 169d and 169e that substantially completely fill the apertures and make electrical contact with the formerly exposed p+ and n+ regions lying beneath these electrodes; (o3) sinters the electrodes at a temperature of substantially T=300-450° C. in H$_2$ gas or another suitable gas (optional); and (o4) deposits silicon nitride of thickness substantially 1-3 μm and temperature T≦400° C. over the upper surface of the structure for passivation and forms apertures therein for the electrical contacts.

Figure 25P:
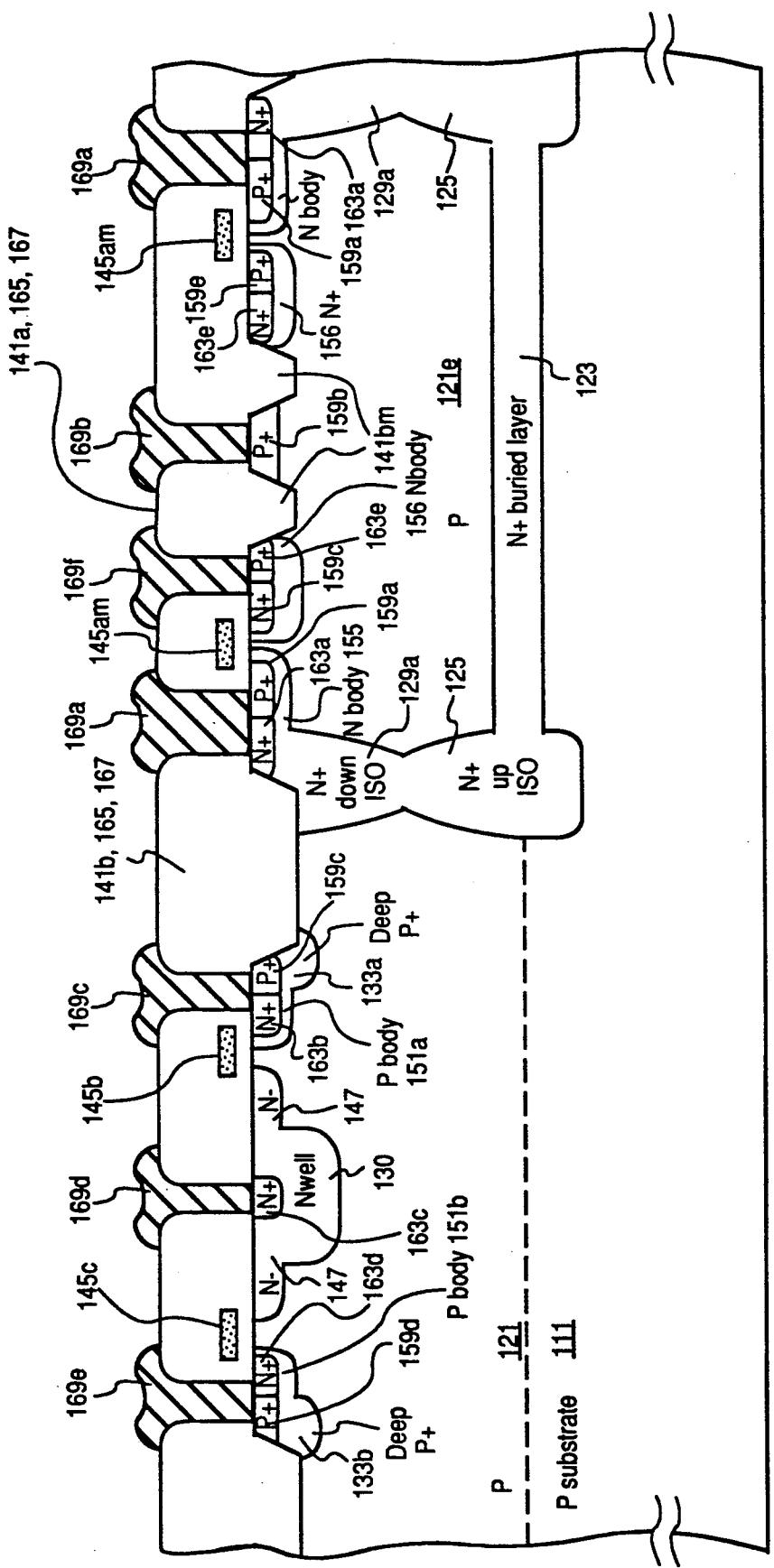

An alternative configuration, illustrated in FIG. 25P, may be obtained by modification of some of the process steps illustrated in FIGS. 25F, 25G, 25J, 25L, 25M and 25O. With reference to FIG. 25F, a modified second field oxide region 141bm is introduced (replacing 141b) that has a smaller lateral width and is spaced apart from the down-isolation region 129 by a larger distance than is shown in FIG. 25F. With reference to FIG. 25G, a modified first gate region 145am is introduced (replacing 145a) that is now spaced apart from both the down-isolation region 129 and from the modified second field oxide region 141bm. With reference to FIG. 25J, a second $n_{body}$ implant region 156' is provided by ion implantation of n type dopant at an exposed portion of the top surface 121et of the enclosed region 121e that lies between the modified second field oxide region 141bm and the modified first gate region 145am; and the $n_{body}$ region 156' preferably forms an annular region that is spaced apart from and is laterally surrounded by the $n_{body}$ implant region 155'. Drive-in of the $p_{body}$ implant regions 155' and 156' proceeds as discussed in connection with FIG. 25K. With reference to FIG. 25L: the third intermediate photoresist layer 157 is also masked to expose a first portion of the new $n_{body}$ region 156 that is adjacent to the modified first gate region 145am; ion implantation of p type dopant of the same dose, substantially $\phi = 10^{14}-10^{16}$ cm$^{-2}$, is also performed to establish a heavily doped p+ region 159'e in the upper part of this first portion of the second $n_{body}$ region 156; and the third intermediate photoresist layer 157 is stripped as before. With reference to FIG. 25M: the fourth intermediate photoresist layer 161 is also masked to expose a second portion of the second $n_{body}$ region 156 (contained in the remainder after the first portion is subtracted) that is adjacent to the modified second field oxide region 141bm; ion implantation of n type dopant of the same dose, substantially $10^{15}-10^{16}$ cm$^{-2}$ is also performed to establish a heavily doped n+ region 163'e in the upper part of this second portion of the second $n_{body}$ region 156; and the fourth intermediate photoresist layer is stripped as before. Drive-in of the p+ implant regions and n+ implant regions to establish p+ regions 159a,b,c,d,e (ninth dopant profiles) and n+ regions 163a,b,c,d,e (tenth dopant profiles) proceeds as discussed in connection with FIG. 25N. With reference to FIG. 25O, a sixth electrode 169f is provided that is electrically coupled to the fifth p+ region 159e and to the fifth n+ region 163e.

The vertical-lateral n-channel LDMOS structure shown in FIG. 23 may be fabricated by beginning with the structure shown in FIG. 25C and performing the following operations: (1) strip the third and fourth oxide layers 127 and 131 to expose the top surface 121t of the covering layer 121; (2) provide an enhanced drain contact 129a (optional) of n+ dopant within the n+ down-isolation region 129 at the top surface thereof, by predeposition or ion implantation plus drive-in; (3) convert the p type enclosed region 121e to an n type enclosed region (an n-well or n-tub) by predeposition and diffusion of rapidly diffusing n dopant throughout the enclosed region; the associated resistivity of the enclosed region 121e is substantially 10–60 Ohm-cm; (4) provide a plurality of deep p+ regions (optional) 240a, 240b, 240c, that are spaced apart from one another and from the down-isolation region 129 and from the up-isolation region 125 and that extend downward into the enclosed region 121e from the top surface thereof 121et; (5) provide a plurality of $p_{body}$ regions 241a, 241b and 241c adjacent to but lying below and spaced apart from the top surface 121et and within the enclosed region 121e (n-well), with these $p_{body}$ regions being spaced apart from one another and lying across a portion of the deep p+ regions 240a, 240b and 240c, respectively; (6) provide a plurality of n+ regions 243a, 243b and 243c lying across upper portions of the $p_{body}$ regions 241a–c and being contiguous to the top surface 121et of the enclosed region 121e, where n+ regions 243a, 243b and 243c are associated with $p_{body}$ regions 241a, 241b and 241c, respectively; the n+ region 21b within the $p_{body}$ region 240b is substantially annular in shape; the n+ regions 241a and 241c may be linear or may be joined together in an annulus that laterally surrounds and is spaced apart form the $p_{body}$ region 240b; (7) provide a plurality of p+ regions 245a, 245b and 245c lying across the upper portions of the respective $p_{body}$ regions 241a, 241b and 241c, and being contiguous to the top surface 121et of the enclosed region 121e, where 245a is adjacent to 243a and lies between n+ region 243a and the down-isolation region 129, 245b is adjacent to and laterally surrounded by 243b, and 245c is adjacent to and lies between n+ region 243d and the down-isolation region 129; (8) provide gate regions 247a and 247b of polysilicon, suitably doped and positioned above and spaced apart a small distance from the top surface 121et of the enclosed region 121e, where gate region 247a overlies the portion of the top surface 121et that lies between n+ regions 245a and 245b and gate region 247b overlies the portion of the top surface 121et that lies between n+ regions 245b and 245c; (9) provide an oxide layer 249 that overlies and is adjacent to the top surface 121et of the enclosed region 121e and that surrounds each of the gate regions 247a and 247b; (10) provide a first (source/body) electrode 251 that is electrically coupled to each of the n+ regions 243a–c and to each of the p+ regions 245a–c and is spaced apart from each of the gate regions 247a–b; (11) provide a second (drain) electrode 253, which may be substantially annular in shape, that is electrically coupled to the n+ down-isolation region 129, either directly or through the optional enhanced drain contact 129a, and is spaced apart from the first electrode 251; and (12) provide an electrical contact 250 to the gate regions 247a and 247b. Each of the following groups of regions may, optionally, be joined together as an annular region: n+ regions 243a and 243c; p+ regions 243a and 243c; and gate regions 247a and 247b.

Additional $p_{body}$ regions containing n+ and p+ regions may be used here.

The lateral n-channel LDMOS structure shown in FIG. 24 may be fabricated by beginning with the structure shown in FIG. 25C and performing the following operations (1) strip the third and fourth oxide layers 127 and 131 to expose the top surface 121t of the covering layer 121; (2) convert the p type enclosed region 121e to an n type enclosed region 121e (an n-well or n-tub) by predeposition and diffusion of rapidly diffusing n dopant throughout the enclosed region; the associated resistivity of the enclosed region 121e is substantially 10–60 Ohm-cm; (3) provide a deep p+ region 134 (optional) in the enclosed region 121e extending downward from the top surface thereof (4) provide a $p_{body}$ 251 adjacent to the top surface 121et of and within the enclosed region 121e, with the $p_{body}$ region 251 being spaced apart from the down-isolation region 129 and lying across a portion of the deep p+ region 134; (5) provide a p+ region 253 within an upper portion of the $p_{body}$ region 251 and contiguous to the top surface 121et of the enclosed region 121e; (6) provide an enhanced drain contact 255a of n+ dopant (optional) within and at the top surface of the down-isolation region 129 and an n+ region 255b within an upper portion of the $p_{body}$ region 251 and contiguous to the top surface 121et of the enclosed region 121e; the p+ region 253 and the n+ region 255b may be but need not be contiguous: (7) provide a gate region 257 that overlies a portion of the enclosed region 121e that lies between the n+ region 255b and the adjacent down-isolation region 129, with the gate region 257 being spaced apart from the top surface 121et of the enclosed region 121e; (8) provide an oxide layer 259 that overlies and is adjacent to the top surface 121et of the enclosed region 121e and that surrounds the gate region 257; (9) provide a first (source/body) electrode 261 that is electrically coupled to the p+ region 253 and to the n+ region 255b; (10) provide a second (drain) electrode 263, which may be substantially annular in shape, that is electrically coupled to the n+down-isolation region 129, either directly or through the optional enhanced drain contact 255a and is spaced apart from the first electrode 251; and (11) provide an electrical contact 265 for the gate region 257.

The structures shown in FIGS. 25C, 25N, 25O and 25P provide IC arrangements that form the basis of many complementary, isolated high voltage and/or low voltage DMOS devices Consider, for example, the high voltage n-channel shown in FIG. 16. This requires the addition of the following to the structure of FIG. 25O: a source/body contact 175 electrically coupled to the third electrode 169c and to the fifth electrode 169e; a drain contact 176 electrically coupled to the third electrode 169c; and a gate contact 177 electrically coupled to the second and third gate regions 145b and 145c. Either or both of the two n+ regions 163b and 163d may serve as source for this device, and the n+ region 163c serves as drain. In each of the FIGS. 10 and 14–24, an electrode and its electrical contact can be combined Voltages of appropriate magnitude are assumed to be supplied at all electrodes/contacts.

The p-channel DMOS transistor shown in FIG. 17 is similarly fabricated. This requires the addition to the structure of FIG. 25C (not including the n-well 130): a first $n_{body}$ region 172a within the enclosed region 121e and adjacent to the down-isolation region 129 and positioned at the top surface 121et of the enclosed regin 121e; a second $n_{body}$ region 172b, positioned within the enclosed region 121e and adjacent to the tope surface thereof and spaced apart from the down-isolation region 129 and from the first $n_{body}$ region 172a; a first n+ region 163a and a first p+ region 159a, both positioned in the first $n_{body}$ region 172a at the top surface of the first $n_{body}$ region; a second n+ region 163e and a second p+ region 159e, both positioned in the second $n_{body}$ region 172b at the top surface of the second $n_{body}$ region; an oxide layer 179 covering the upper surface of the structure; a third p+ region 159b, positioned within the enclosed region 121e at the tope surface thereof and spaced apart from and lying between the second $n_{body}$ region 172b and the down-isolation region 129; a gate region 145a positioned within the oxide layer 179 and spaced apart from the top surface 121et of the enclosed region and overlying a portion of each of the first and second p+ regions 159a and 159e; a first electrode 178 that is electrically coupled to the first and second n+ regions 163a and 163e, to the first and second p+ regions 159a and 159e and to the down-ios. region 129; a second-electrode 178 that is electrically coupled to the third p+ region 159b; and an electrical contact 180 that is electrically coupled to the gate region 145a. Either or both of the first and second p+ regions 159a and 159e may serve as a source, and the third p+ region 159b may serve as a drain.

Figure 18:
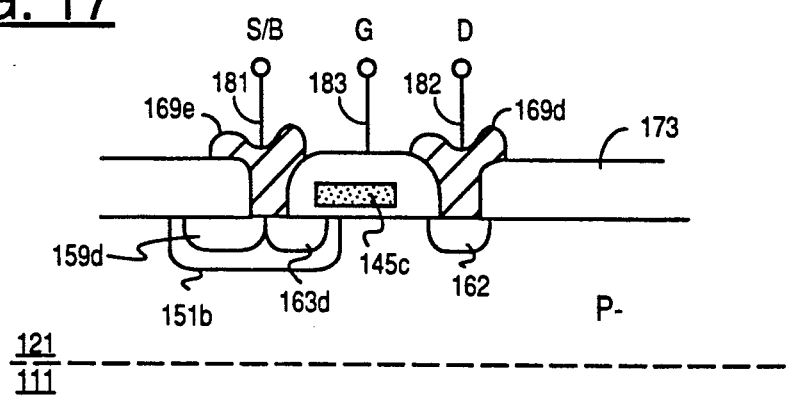
FIG. 18 is a schematic cross-sectional view of a low voltage, common body, n-channel DMOS transistor fabricated according to the invention.

The common body n-channel DMOS low voltage transistor shown in FIG. 18 may be fabricated with the following modification of the structure of FIG. 25C: eliminate or remove the n-well region 130; provide a $p_{body}$ region 151b in the covering layer 121 at the top surface thereof, spaced apart from the down-isolation region 129 and from the enclosed region 121e; provide a first n+ region 163f that is contained in the covering layer 121 at the top surface thereof and is spaced apart from the down-isolation region 129, from the enclosed region 121e and from the $p_{body}$ region 151b; provide a second n+ region 163d contained in an upper portion of the $p_{body}$ region 151b at the top surface thereof; provide a p+ region 159d that is contained in an upper portion of the $p_{body}$ region 151b at the top surface thereof and is positioned so that the n+ region 163d lies between the p+ region 159d and the n+ region 163f; provide an oxide layer 173 overlying the upper surface of the structure; provide a gate region 145c that is contained in the oxide layer and spaced apart from the top surface of the covering layer 121 and overlies a portion of each of the first n+ region 163f and the second n+ region 163d; provide a first electrode 181 that is electrically coupled to the second n+ region 163d (as source) and to the p+ region 159d; provide a second electrode 182 that is electrically coupled to the first n+ region 163f (as drain); and provide an electrical contact 183 that is electrically coupled to the gate region 145c.

Figure 19:
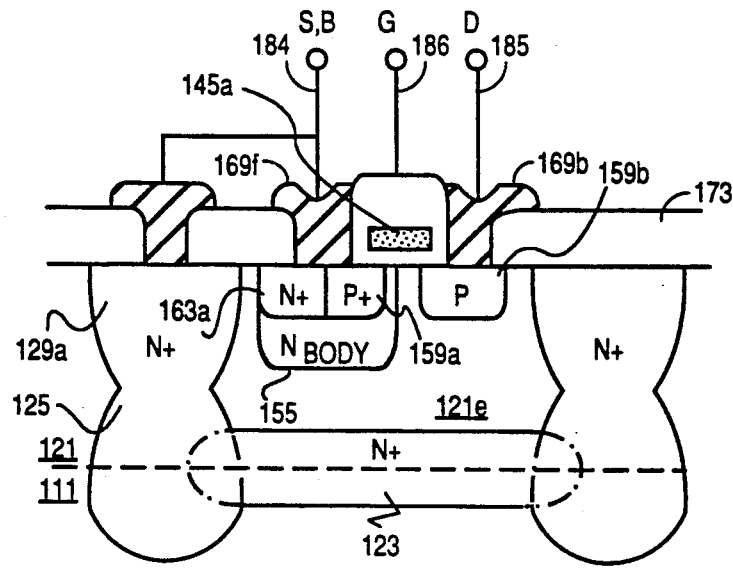
FIG. 19 is a schematic cross-sectional view of a low voltage, common drain isolated, p-channel DMOS transistor fabricated according to the invention.

The common drain isolated p-channel DMOS device shown in FIG. 19 may be fabricated by adding the following to the FIG. 25P structure: an $n_{body}$ region 155, positioned within the enclosed region 121e and adjacent to the top surface thereof; a first p+ region 159b, positioned within the enclosed region 121e and contiguous to the top surface thereof and spaced apart from the down-isolation region 129 and from the $n_{body}$ region 155; a second p+ region 159a, positioned in an upper portion of the body region 155 at the top surface thereof; an n+ region 163a, positioned in an upper portion of the $n_{body}$ region 155 at the top surface thereof so that the second p+ region 159a lies between the n+ region 163a and the first p+ region 159b; an oxide layer 173 that overlies the upper surface of the structure; a gate region 145a contained within the oxide layer 173 and spaced apart from the top surface of the enclosed region 121e and overlying a portion of each of the first p+ region 159b and the second p+ region 159a; a first electrode 184 electrically coupled to the down-isolation region 129, to the n+ region 163a and to the p+ region 159a; a second electrode 185 electrically coupled to the p+ region 159b; and an electrode contact 186 electrically coupled to the gate region 145a.

Figure 20:
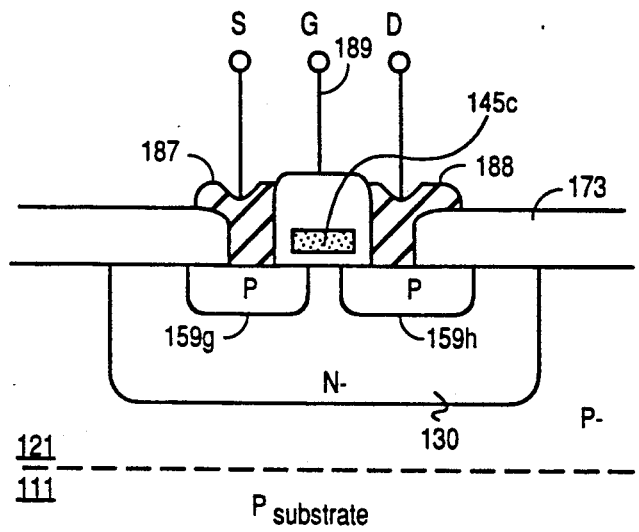
FIG. 20 is a schematic cross-sectional view of a low voltage, n-well PMOS transistor fabricated according to the invention.

The n-well PMOS device shown in FIG. 20 may be fabricated by adding the following steps to the process discussed in connection with FIGS. 25A-25C: provide first and second p+ regions 159g and 159h within the n-well 130, spaced apart and each being positioned at the top surface of the n-well; provide an oxide layer 173 overlying the top surface of the n-well 130; provide a gate region 145c, contained within the oxide layer 173 and spaced apart from the top surface of the n-well 130 and overlying a portion of each of the p+ regions 159g and 159h; provide a first electrode 187 and second electrode 188 that are electrically coupled to the first and second p+ regions 159g and 159h, respectively; and provide an electrical contact 189 that is electrically coupled to the gate region 145c. Either p+ region 159g and 159h can serve as source or as drain.

Figure 21:
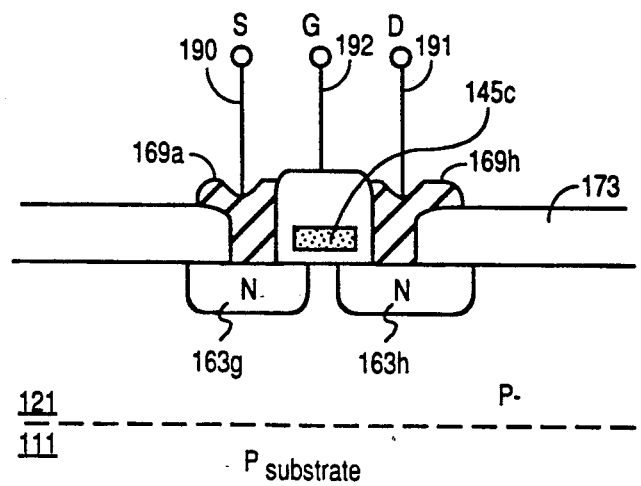
FIG. 21 is a schematic cross-sectional view of a low voltage, NMOS transistor fabricated according to the invention

The NMOS device shown in FIG. 21 may be fabricated by adding the following steps to the process discussed in connection with FIGS. 25A-25C (without the n-well 130): provide first and second n+ regions 163g (source) and 163h (drain) in the covering layer 121 at the top surface thereof, spaced apart from one another and from the down-isolation region 129 and from the enclosed region 121e; providing an oxide layer 173 that overlies the top surface of the covering layer 121; provide a gate region 145c contained within the oxide layer 173 and spaced apart from the top surface of the covering layer 121 and overlying a portion of each of the first and second n+ regions 163g and 163h, provide a first electrode 190 and a second electrode 191 that are electrically coupled to the first and second n+ regions 169g and 169h, respectively; and provide an electrical contact 192 that is electrically coupled to the gate region 145c.

Figure 22:
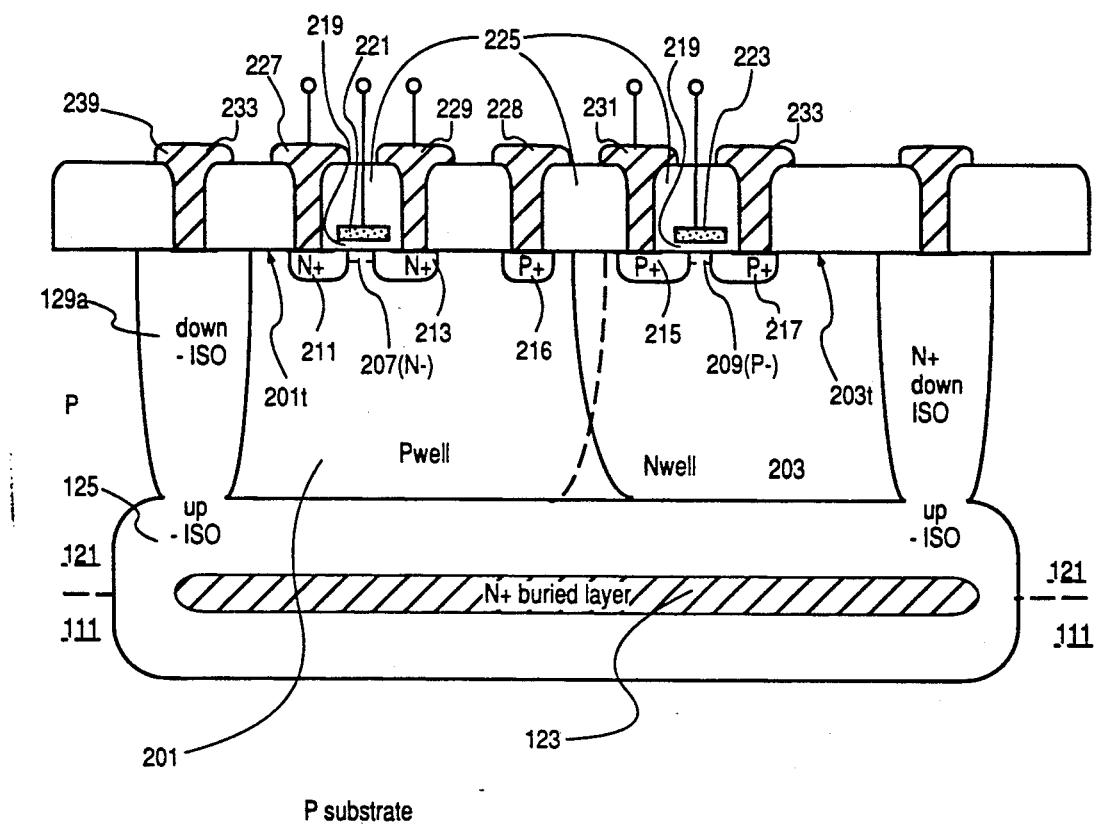
FIG. 22 is a schematic cross-sectional view of a low voltage, twin-tub CI configuration fabricated according to the invention that allows use of a NMOS transistor and a PMOS transistor in the same isolated region.

To obtain the isolated twin tub (p-well +n-well) shown in FIG. 22, one begins with the configuration shown in FIG. 25C (without the n-well 130) and removes the third and fourth oxide layers that overlie the enclosed portion 121e of the covering layer 121. Using alternating masking, a p dopant is diffused or implanted throughout a portion of the enclosed region 121e (optional; used if the p doping concentration is to be increased) that is contiguous to a first portion of the up-isolation region 125 and down-isolation region 129 so that this doped region forms a p-tub or p-well 201 that includes substantially one half of the enclosed region 121e, as shown in FIG. 22. Using another mask, the remaining portion of the enclosed region 121, contiguous to the remaining portions of the up-isolation region 125 and the down-isolation region 129, is converted by diffusion or implant of n dopant throughout to an n-tub or n-well 203, as shown in FIG. 22. The p-well 201 and the n-well 203 will overlap somewhat near the center of the enclosed region 121e, but this should cause no problems for devices positioned far from this interface within the enclosed region 121e. Using selective masking or selective formation of apertures in an oxide layer at the top surface of the enclosed region 121e, a shallow n− threshold adjust region 207 (optional) is introduced by diffusion or ion implantation adjacent to a portion of the top surface 201t of the p-well 201 (n concentration corresponding to a dose of substantially $5 \times 10^{11} - 5 \times 10^{12}$ cm$^{-2}$); and a shallow p-threshold adjust region 209 (optional) is introduced adjacent to a portion of the top surface 203t of the n-well 203 (p concentration corresponding to a dose of substantially $5 \times 10^{11} - 5 \times 10^{12}$ cm$^{-2}$). Using selective masking or aperture formation, two n+ regions 211 and 213, spaced apart by a portion of the n− threshold adjust region 207, are introduced at the top surface 201t of the p-well 201; and two p+ regions 215 and 217, spaced apart by a portion of the p− threshold adjust region 209, are introduced at the top surface 203t of the n-well 203. The two n+ regions 211 and 213 will serve as source and drain for an n-channel MOS transistor; and the two p+ regions 215 and 217 will serve as source and drain for a p-channel MOS transistor. A separate p+ region 216 is provided at the top surface 207t of the p-well 207 that is spaced apart from the p+ regions 215 and 217 and from the n+ regions 211 and 213. The p+ region 216 will serve as voltage level adjuster for the p-well material A thin oxide layer 219 is then grown over the upper surface of the structure. A first gate region 221 of polysilicon, suitably doped, is sequentially deposited, doped and patterned at the top surface of the oxide layer 219 in a region overlying the n− threshold-adjusted channel 207 between the two n+ regions 211 and 213, to serve as a gate for the n-channel MOS transistor. Similarly, a second gate region 223 of polysilicon, suitably doped, is grown at the top surface of the oxide layer 219 in a region overlying the p− threshold-adjusted channel 209 between the two p+ regions 215 and 217, to serve as a gate for the p-channel MOS transistor. An oxide layer 225 is then grown over the upper surface of the structure. Two apertures are then etched in the oxide layers 219 and 225 covering the upper surface of the structure at positions overlying the two n+ regions 211 and 213 to expose all or a portion of the top surfaces of these two n+ regions; and electrically conducting material is deposited in these apertures to serve as electrodes 227 and 229 in contact with the n+ regions 211 and 213, respectively. Another electrode 228 is provided that electrically contacts the voltage level adjustment region 216 for the p-well 207. In a similar manner, two apertures are etched in the oxide layers 219 and 225 to expose all or a portion of the top surfaces of the two p+ regions 215 and 217; and electrically conducting material is deposited in these apertures to form electrodes 231 and 233 in contact with the two p+ regions 215 and 217, respectively. Electrical contacts 235 and 237 are provided for the gate regions 221 and 223, respectively Finally, an aperture 192 is etched in the oxide layers 219 and 225 to expose at least a portion of the down-isolation region 129a, and electrically conducting material is deposited in the aperture to provide an electrical contact 239 for the up-isolation and down-isolation regions 125 and 129. The apparatus shown in FIG. 22 will have annular buried layer 123 and up-isolation and down-isolation regions, but the p-well and n-well regions are preferably not annular. The apparatus shown in FIG. 22 provides a CI p-channel MOS transistor and a CI n-channel MOS transistor, both within the same enclosed tub region, for low voltage applications. The tubs enclosed by the enclosed region 121 may have a high breakdown voltage relative to the substrate 111 or to the remainder of the covering layer 121.

The invention shown and described herein provides several basic structures, shown in FIGS. 25C, 25N, 25O, and 25P and sometimes called "pre-transistor structures" herein, from which a variety of transistor devices may be fabricated with the addition of a few electrodes and electrical contacts.

The IC device shown in FIG. 10 may also be fabricated from a pre-transistor structure, using the configuration shown in FIG. 25O unaltered, adding only an electrical contact 193 for the gate region 145a; a very heavily doped n++ region 162 may also be added within the down-isolation region 129a to serve as a contact for the electrode 169a. No other changes are required. The IC device shown in FIG. 10 provides a complementary isolation (CI) implementation of a high voltage p-channel lateral DMOS transistor, using the n+ wrap-around isolation.

The IC device shown in FIG. 14 may be fabricated beginning with the pre-transistor structure shown in FIG. 25C (without the n-well 130), with the third and fourth oxide layers 127 and 131 in place. One then provides an aperture adjacent to the center of the enclosed region 121e that exposes a portion of the top surface 121et of the enclosed region 121 and introduces an $n_{body}$ dopant, such as phosphorus, at a dose of substantially $\phi = 10^{13} - 5 \times 10^{14}$ cm$^{-2}$ at the exposed top surface of the enclosed region 121e. Alternatively, as noted above in the discussion of FIGS. 25A–25P, one can alternatively use an intermediate photoresist layer and ion implantation through the (thin) oxide layers 127 and 131 in order to establish the $n_{body}$ region 154. One then provides a fifth oxide layer 136 over the upper surface of the structure and then provides an annular aperture through the fifth oxide layer 136 to expose an annular region that overlies the outer boundary of the $n_{body}$ region 154. One then introduces n type dopant at the exposed portion of the top surface 121et of the enclosed region 121e and allows the dopant to move into the enclosed region 121e from the top thereof to establish an annular n+ region 164. One then provides a sixth oxide layer 138 over the upper surface of the structure. One then provides a first aperture in the fifth and sixth oxide layers 136 and 138 to expose a portion of the top surface of the enclosed region 121e that is laterally surrounded by the n+ region 164 previously established and provides a second aperture, which is annular, that exposes a portion of the enclosed region 121e that is spaced apart from and laterally surrounds the n+ region 164 previously established. One then introduces p type dopant and establishes a first p+ region 160a adjacent to the top surface 121et of the enclosed region 121e and laterally surrounded by the annular n+ region 164 and establishes a second p+ region 160b, which is annular in shape, that is adjacent to the top surface of the enclosed region 121e and laterally surrounds the n+ region 164, the p+ region 160a and the $n_{body}$ region 154. The p+ region 160b may be of substantially the same depth as the n+ region 164 and/or the p+ region 160a; or, optionally, this region may become a deep p+ region 134 that is introduced in the enclosed region 121e at the same time the deep p+ regions 133a and 133b are introduced in FIG. 25D. One then provides a seventh oxide layer 144 over the upper surface of the structure and forms apertures therein that allow electrode contact with the down-isolation region 129a (electrode 170a), the first p+ regions 160a and 160b (electrodes 170b and 170d), and the n+ region 164 (electrode 170c). As illustrated in FIG. 14, this provides a vertical, isolated pnp transistor using the CI technique, where the heavily doped regions 160a, 164 and 160b act as emitter, base and collector, respectively.

The device shown in FIG. 15 may also be fabricated beginning with the pre-transistor structure shown in FIG. 25C (without the n-well 130) with the third and fourth oxide layers 127 and 131 in place. The semiconductor material in the enclosed region 121e should be converted to n type material so that the enclosed region forms an isolated n-well. One then provides an aperture in the third and fourth oxide layers 127 and 131 to expose a portion of the top surface 121et of the enclosed region 121e of the covering layer 121 adjacent to the center of the enclosed region 121e. One then introduces p type dopant at this exposed portion and allows the dopant to move into the enclosed region from the top surface thereof to establish a $p_{body}$ region 152, after suitable drive-in is performed. One then provides a fifth oxide layer 136 over the upper surface of the structure and provides a new aperture, annular in shape, in the fifth oxide layer that overlies the outer boundary of the $p_{body}$ region 152. One then introduces p type dopant at the exposed portion of the top surface 121et of the enclosed region 121e and allows the dopant to move into the enclosed region 121e a short distance from the top surface thereof to establish a p+ region 158 that is annular in shape and that overlies the outer boundary of the $p_{body}$ region 152. One then provides a sixth oxide layer 138 over the upper surface of the structure and provides an aperture in the fifth and sixth oxide layers 136 and 138 to expose a portion of the top surface of the enclosed region 121e that is laterally surrounded by the p+ region 158 that was previously established. One then introduces an n type dopant at this exposed portion and allows the dopant to move into the enclosed region 121e a short distance from the top surface thereof to establish a shallow n+ region 166 that is laterally surrounded by the p+ region 158 and that overlies a portion of the $p_{body}$ region 152. One then provides a seventh oxide layer 144 over the upper surface of the structure. Finally, one provides apertures in the third, fourth, fifth, sixth and seventh oxide layers 127, 131, 136, 138 and 144 to allow separate electrode contact with the down-isolation region 129a (electrode 171a), the n+ region 166 (electrode 171b), and the p+ region 158 (electrode 171c) Optionally, an annular n++ region 162 may be provided at a portion of the top surface of the down-isolation region 129 to provide low resistance contact of the electrode 171a with the down-isolation region 129a. The down-isolation region 129, the n+ region 166 and the p+ region 158 serve as collector, emitter and base, respectively, for a vertical, isolated NPN transistor using the CI technique, as illustrated in FIG. 15. In the embodiments shown in FIGS. 10, 14 and 16-21 discussed herein, it is preferable to diffuse p dopant of dose substantially $5 \times 10^{11} - 5 \times 10^{12}$ cm$^{-2}$ throughout the enclosed region 121e after the enclosed region is formed. In the embodiment shown in FIG. 22, it is preferable to diffuse p dopant of dose substantially $5 \times 10^{11} - 5 \times 10^{12}$ cm$^{-2}$ throughout the p-well 201 after the enclosed region 121e is formed.

The advantages and differences of this invention over the prior art include the following:

uses both rapid- and slow-diffusing n type dopant in selected regions to (a) form a low resistance buried collector region and (b) minimize the parasitic vertical current gain of the pnp transistor formed by the drain of the p-channel DMOS transistor (acting as emitter), the n type isolation region (acting as base), and the p type substrate and surrounding p type epitaxial region (acting as collector) of FIG. 10;

uses a p type epitaxial layer on a p type substrate to suppress or avoid forming the parasitic vertical npn transistor that exists with an n type substrate;

provides high voltage complimentary bipolar transistors;

the presence of the n+ regions surrounding p type regions reduces the parasitic pnp gain so that no four-layer (SCR) action can occur; as a result, low voltage logic regions may be separated from high voltage devices, preventing unwanted parasitic devices from becoming active;

the p type region, surrounded by the n+ isolation and buried layer, provides a pocket that may be biased at a voltage different from the voltage on the substrate; the same is true for the n-well regions; and the back gate bias effect on any MOS transistor may be reduced to zero by shorting the source and body regions; this occurs because the body regions may be biased at voltages different from the voltage on the substrate by isolating regions, using n type diffusions.

Figure 26:
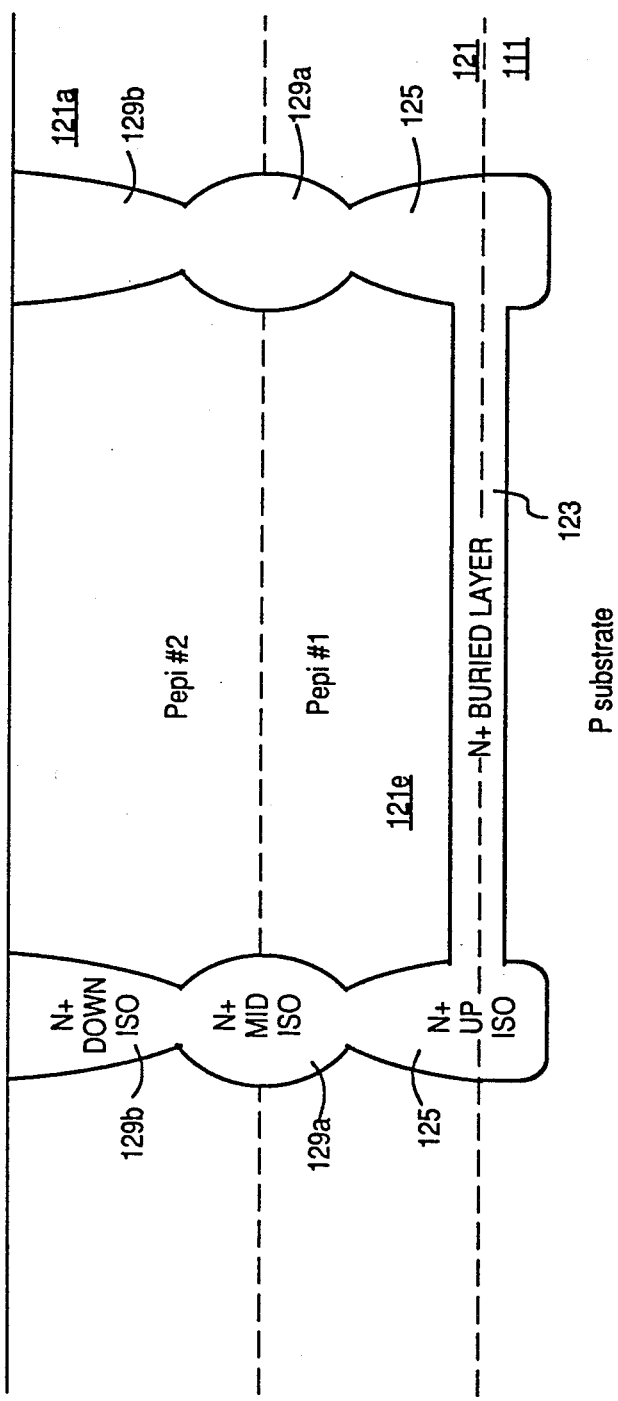
FIG. 26 is a schematic cross-sectional view of a device including a three-layer structure in accordance with the invention.

A three-layer structure, as shown in FIG. 26, can be fabricated by depositing a second p type covering layer 121a and allowing the n dopant which forms the third dopant profile to diffuse upward into the second covering layer. Rapidly diffusing n dopant is then diffused into second covering layer 121a in a substantially annular pattern which overlies the third dopant profile, in the manner described above in connection with FIG. 25C, to form fourth dopant profile 129b.

The structures discussed herein may also be fabricated by exchanging roles of p type and n type material and of n type and p type dopant. One would then begin with a lightly doped n type substrate 111 in FIG. 25A and proceed by analogy.

Although the preferred embodiments have been shown and described herein, variation and modification may be made without departing from the scope of the invention.

We claim:

1. A method of producing a complementary MOS transistor pair comprising the steps of:

providing a lightly doped semiconductor substrate of a first electrical conductivity type having a top surface;

providing a covering layer of lightly doped semiconductor material of first conductivity type, contiguous to and overlying the top surface of the substrate, with the substrate and the covering layer having an interface therebetween and the covering layer having a top surface;

providing a slowly diffusing dopant of a second electrical conductivity type opposite to that of the first conductivity type at a first portion of the substrate-covering layer interface, and allowing the slowly diffusing dopant to diffuse into the covering layer to produce a first dopant profile therein;

providing a rapidly diffusing dopant of second conductivity type at a second portion of the substrate-covering layer interface that is substantially annular and adjoins and laterally surrounds the first portion of the substrate-covering layer interface, and allowing the rapidly diffusing dopant to diffuse upward into the covering layer to produce a second dopant profile therein;

providing a rapidly diffusing dopant of second conductivity type at a first portion of the top surface of the covering layer that is substantially annular and substantially overlies the second portion of the substrate-first covering layer interface, and allowing this dopant to diffuse downward into the covering layer to produce a third dopant profile that has a top surface and that meets and merges with the second dopant profile, where the first dopant profile, the second dopant profile, the third dopant profile and the top surface of the covering layer bound and define an enclosed region of the covering layer that has a top surface and that is electrically isolated from the substrate and from the remainder of the covering layer;

providing a rapidly diffusing dopant of second conductivity type at a second portion of said top surface of said covering layer that is spaced apart from and is not laterally surrounded by said first portion of said top surface of said covering layer, and allowing this dopant to diffuse downward into said covering layer to form a fourth dopant profile therein that has a top surface;

providing two deep fifth dopant profiles of heavily doped first conductivity type extending downward from said top surface of said covering layer and not within said enclosed region, with the first of the fifth dopant profiles lying between and being spaced apart from said third dopant profile and said fourth dopant profile, and with the second of the fifth dopant profiles being spaced apart from said fourth dopant profile and being positioned so that said fourth dopant profile lies between the first and second of the fifth dopant profiles;

providing three field oxide regions at said top surface of said covering layer, with the first field oxide region being substantially annular in shape and overlying and extending downward into a portion of said third dopant profile and downward into a portion of the first of the fifth dopant profiles, with the second field oxide region being substantially annular in shape and overlying and extending downward into a portion of the enclosed region, and with the third field oxide region overlying and extending downward into a portion of the second of the sixth dopant profiles;

providing a thin oxide layer of thickness substantially 0.02–0.25 μm over the upper surface of the structure;

providing three gate regions of doped semiconductor material on the first oxide layer, with the first gate region being substantially annular in shape and laterally surrounding and adjacent to a portion of the second field oxide region, with the second gate region lying above a portion of said covering layer that is spaced apart from and lies between said fourth dopant profile and the first of the fifth dopant profiles, and with the third gate region overlying a portion of said covering layer that is spaced apart from and lies between said fourth dopant profile and the second of the fifth dopant profiles, with each gate region containing polysilicon that is doped to a resistivity of substantially 25–50 Ohm/-square;

providing a thin sixth dopant profile of lightly doped second conductivity type in said covering layer adjacent to said top surface thereof at all portions of said top surface that do not underlie the first, second or third field oxide regions or the first, second or third gate regions;

providing two seventh dopant profiles of lightly doped first conductivity type in said covering layer adjacent to said top surface thereof, where the first of the seventh dopant profiles lies between the first field oxide region and a portion of said covering layer that underlies the second gate region, and where the second of the seventh dopant profiles lies between the third field oxide region and a portion of said covering layer that underlies the third gate region;

providing an eighth dopant profile of lightly doped second conductivity type within said enclosed region and adjacent to the top surface thereof where the eighth dopant profile is substantially annular and adjacent to and electrically connected to said third dopant profile and a portion of the eighth dopant profile underlies at least a portion of the first gate region;

providing four ninth dopant profiles of heavily doped first conductivity type lying in said covering layer or said enclosed region adjacent to said top surface of said covering layer, with the first of the ninth dopant profiles lying in an upper portion of the first of the eighth dopant profiles at a position spaced apart from said third dopant profile, and with a portion of the first of the ninth dopant profiles underlying at least a portion of the first gate region, with the second of the ninth dopant profiles being contiguous and being laterally surrounded by the second field oxide region, with the third of the ninth dopant profiles lying in an upper portion of the first of the seventh dopant profiles at a position adjacent to the first field oxide region and spaced apart from the portion of said covering layer that underlies the second gate region, and with the fourth of the ninth dopant profiles lying in an upper portion of the second of the seventh dopant profiles adjacent to the third field oxide region and spaced apart from the portion of said covering layer that underlies the third gate region;

providing four tenth dopant profiles of heavily doped second conductivity type within said covering layer or said enclosed region and adjacent to said top surface of said covering layer, with the first of the tenth dopant profiles lying at an upper portion of said third dopant profile and of said enclosed region that extends from the first field oxide region to the first of the ninth dopant profiles, with the second of the tenth dopant profiles lying in an upper portion of the first of the seventh dopant profiles spaced apart from the first field oxide region; and with a portion of the second of the tenth dopant profiles underlying at least a portion of the second gate region, with the third of the tenth dopant profiles lying within said fourth dopant profile and being adjacent to a portion of said top surface thereof, and with the fourth of the tenth dopant profiles lying in an upper portion of the second of the seventh dopant profiles spaced apart from the third field oxide region, and with a portion of the fourth of the tenth dopant profiles underlying at least a portion of the third gate region; and providing a thick oxide layer over the upper surface of the structure.

2. The method of claim 1, further comprising the steps of:

combining said third field oxide region and a portion of said first field oxide region as part of a third substantially annular field oxide region;

combining said first and said second of said fifth dopant profiles as part of a substantially annular, deep, heavily doped region;

combining said second gate region and said third gate region as part of a second substantially annular gate region;

combining said first and said second of said seventh dopant profiles as part of a substantially annular body region;

combining said third and said fourth of said ninth dopant profiles a part of a substantially annular body contact region;

combining said second and said fourth of said tenth dopant profiles as part of a substantially annular source region; and combining the portions of said sixth dopant profile that lie between said fourth dopant profile and the second substantially annular gate region as part of a substantially annular drift region.

3. The method according to claim 1, further comprising the steps of:

providing a first electrode that is electrically coupled to said first of said ninth dopant profiles and to said first of said tenth dopant profiles;

providing a second electrode that is electrically coupled to said second of said ninth dopant profiles; and providing an electrical contact for said first gate region.

4. The method of claim 1, further comprising the steps of:

providing an electrode that is electrically coupled to said third of said tenth dopant profiles;

providing an electrode that is electrically coupled to said third of said ninth dopant profiles and to said second or said fourth of said tenth dopant profiles; and providing an electrical contact for said second or said third gate region.

5. The method of claim 1, further comprising the steps of:

providing a deep eleventh dopant profile of second conductivity type within said enclosed region and extending to the top surface thereof, where the eleventh dopant profile is substantially annular and is positioned between and spaced apart from said eighth dopant profile and said second of said ninth dopant profiles and is adjacent to the portion of said top surface of said enclosed region that underlies gate region;

providing a twelfth dopant profile, of heavily doped first conductivity type, that is contained within the eleventh dopant profile and extends to a portion of the top surface thereof, where a portion thereof underlies at least a portion of said first gate region;

providing a thirteenth dopant profile, of heavily doped second conductivity type, that is contained within the eleventh dopant profile and extends to a portion of the top surface thereof and that lies between said second field oxide region and the twelfth dopant profile; and providing an electrode that is electrically coupled to the twelfth and thirteenth dopant profiles.

6. The method of claim 1, wherein the step of providing at least one of said fifth dopant profiles, said sixth dopant profiles, said seventh dopant profiles, said eighth dopant profile, said ninth dopant profiles or said tenth dopant profiles comprises the steps of:

providing an aperture in the upper surface of the structure to expose a portion of said top surface of said covering layer or said top surface of said enclosed region that overlies the position of said dopant profile to be formed;

introducing dopant by predeposition in a thin layer at the exposed portion; and allowing the dopant to move into said covering layer or said enclosed region by diffusion to form said dopant profile.

7. The method of claim 1, wherein the step of providing at least one of said fifth dopant profiles, said sixth dopant profiles, said seventh dopant profiles, said eighth dopant profile, said ninth dopant profiles or said tenth dopant profiles comprises the steps of:

providing an aperture in the upper surface of the structure to expose a portion of said top surface of said covering layer or said top surface of said enclosed region that overlies the position of said dopant profile to be formed;

introducing dopant at the exposed portion by ion implantation into said covering layer or said enclosed region; and allowing the dopant to move into said covering layer or said enclosed region by diffusion to form said dopant profile.

8. The method of claim 1, wherein said step of providing at least one of said sixth dopant profiles or said seventh profile or ... or eleventh dopant pr. comprises the steps of:

providing a layer of photoresist material over the upper surface of the structure;

providing a mask of selected portions of the photoresist layer so that a portion of the photoresist layer that overlies the position of the dopant profile to be formed is removed;

introducing dopant by ion implantation through the portion of the photoresist layer that has been removed into said covering layer or said enclosed region; and allowing the implanted ions to move into said covering layer or said enclosed region by diffusion to form said dopant profile.

9. The method of claim 1, further comprising the steps of:

providing a first electrode that is electrically coupled to said second of said tenth dopant profiles to said third of said ninth dopant profiles, to said fourth of said tenth dopant profiles and to said fourth of said ninth dopant profiles;

providing a second electrode that is electrically coupled to said third and said tenth dopant profiles; and providing an electrical contact to said second gate region and to said third gate region.

10. A method for producing a bipolar transistor comprising the steps of:

providing a lightly doped semiconductor substrate of a first electrical conductivity type having a top surface;

providing a covering layer of lightly doped semiconductor material of first conductivity type, contiguous to and overlying the top surface of the substrate, with the substrate and the covering layer having an interface therebetween and the covering layer having a top surface;

providing a slowly diffusing dopant of a second electrical conductivity type opposite to that of the first conductivity type at a first portion of the substrate-covering layer interface, and allowing the slowly diffusing dopant to diffuse into the covering layer to produce a first dopant profile therein;

providing a rapidly diffusing dopant of second conductivity type at a second portion of the substrate-covering layer interface that is substantially annular and adjoins and laterally surrounds the first portion of the substrate-covering layer interface, and allowing the rapidly diffusing dopant to diffuse upward into the covering layer to produce a second dopant profile therein;

providing a rapidly diffusing dopant of second conductivity type at a first portion of the top surface of the covering layer that is substantially annular and substantially overlies the second portion of the substrate-first covering layer interface, and allowing this dopant to diffuse downward into the covering layer to produce a third dopant profile that has a top surface and that meets and merges with the second dopant profile, where the first dopant profile, the second dopant profile, the third dopant profile and the top surface of the covering layer bound and define an enclosed region of the covering layer that has a top surface and that is electrically isolated from the substrate and from the remainder of the covering layer;

providing a collector region, of highly doped first conductivity type, positioned within said enclosed region and contiguous to said top surface of said enclosed region and spaced apart from said third dopant profile;

providing an emitter region, of highly doped first conductivity type, positioned within said enclosed region and contiguous to said top surface thereof, where the collector region is spaced apart from the emitter region and from said third dopant profile;

providing a base contact region, of highly doped second conductivity type, within the enclosed region of the covering layer and positioned contiguous to the top surface thereof where the base contact region laterally surrounds and is adjacent to the emitter region and lies between the collector and emitter regions;

providing a base region of second conductivity type, positioned within said enclosed region and underlying and contiguous to the emitter region and to at least a portion of the base contact region; and providing first, second, third and fourth electrodes, electrically coupled to the collector region, to the emitter region, to the base contact region and to said third dopant profile, respectively.

11. The method of claim 10, wherein said collector region is provided as an annular region within said enclosed region and said emitter region is laterally surrounded by said collector region.

12. The method of claim 10, further comprising the step of providing a deep, heavily doped region of first conductivity type, spaced apart from said third dopant profile and from said base contact region and positioned within said enclosed region and laterally surrounding and extending below said collector region.

13. A method for producing a bipolar transistor comprising the steps of:
providing a lightly doped semiconductor substrate of a first electrical conductivity type having a top surface;
providing a covering layer of lightly doped semiconductor material of first conductivity type, contiguous to and overlying the top surface of the substrate, with the substrate and the covering layer having an interface therebetween and the covering layer having a top surface;

providing a slowly diffusing dopant of a second electrical conductivity type opposite to that of the first conductivity type at a first portion of the substrate-covering layer interface, and allowing the slowly diffusing dopant to diffuse into the covering layer to produce a first dopant profile therein;

providing a rapidly diffusing dopant of second conductivity type at a second portion of the substrate-covering layer interface that is substantially annular and adjoins and laterally surrounds the first portion of the substrate-covering layer interface, and allowing the rapidly diffusing dopant to diffuse upward into the covering layer to produce a second dopant profile therein;

providing a rapidly diffusing dopant of second conductivity type at a first portion of the top surface of the covering layer that is substantially annular and substantially overlies the second portion of the substrate-first covering layer interface, and allowing this dopant to diffuse downward into the covering layer to produce a third dopant profile that has a top surface and that meets and merges with the second dopant profile, where the first dopant profile, the second dopant profile, the third dopant profile and the top surface of the covering layer bound and define an enclosed region of the covering layer that has a top surface and that is electrically isolated from the substrate and from the remainder of the covering layer;

converting the portion of said covering layer material that forms said enclosed region from first conductivity type to second conductivity type;

providing an emitter region of highly doped second conductivity type, positioned within said enclosed region and contiguous to said top surface of said enclosed region and spaced apart from said third dopant profile;

providing a base contact region of highly doped first conductivity type, positioned within said enclosed region and contiguous to said top surface thereof and adjacent to and laterally surrounding the emitter region, spaced apart from said third dopant profile;

providing a base region of first conductivity type, positioned within said enclosed region underlying and contiguous to the emitter region and to at least a portion of the base contact region; and providing first, second and third electrodes, electrically coupled to the emitter region, to the base contact region and to said third dopant profile, respectively.

14. The method of claim 13, further comprising the step of providing a heavily doped region of second conductivity type as a contact region or said third electrode, the heavily doped region being positioned within said third dopant profile and contiguous to said top surface thereof.

15. A method for producing a parasitic-free MOS transistor comprising the steps of:
providing a lightly doped semiconductor substrate of a first electrical conductivity type having a top surface;
providing a covering layer of lightly doped semiconductor material of first conductivity type, contiguous to and overlying the top surface of the substrate, with the substrate and the covering layer having an interface therebetween and the covering layer having a top surface;

providing a slowly diffusing dopant of a second electrical conductivity type opposite to that of the first conductivity type at a first portion of the substrate-covering layer interface, and allowing the slowly diffusing dopant to diffuse into the covering layer to produce a first dopant profile therein;

providing a rapidly diffusing dopant of second conductivity type at a second portion of the substrate-covering layer interface that is substantially annular and adjoins and laterally surrounds the first portion of the substrate-covering layer interface, and allowing the rapidly diffusing dopant to diffuse upward into the covering layer to produce a second dopant profile therein;

providing a rapidly diffusing dopant of second conductivity type at a first portion of the top surface of the covering layer that is substantially annular and substantially overlies the second portion of the substrate-first covering layer interface, and allowing this dopant to diffuse downward into the covering layer to produce a third dopant profile that has a top surface and that meets and merges with the second dopant profile, where the first dopant profile, the second dopant profile, the third dopant profile and the top surface of the covering layer bound and define an enclosed region of the covering layer that has a top surface and that is electrically isolated from the substrate and from the remainder of the covering layer;

providing a body region of second conductivity type, positioned within said enclosed region and adjacent to said top surface thereof and adjacent to the third dopant profile so that the body region forms a substantially annular region within said enclosed region;

providing a source region of heavily doped first conductivity type, positioned within the body region and contiguous to said top surface of said enclosed region so that the source region forms a substantially annular region within said enclosed region;

providing a drain region of heavily doped first conductivity type, positioned within said enclosed region at the top surface thereof and spaced apart from the body region;

providing an oxide layer that overlies said top surface of said enclosed region;

providing a gate region that is contained within the oxide layer that is substantially annular, that overlies and is spaced apart from a portion of said enclosed region that is adjacent to the source region and that overlies a portion of the source region, and that extends toward the drain region;

providing a ground region of heavily doped first conductivity type within said covering layer and contiguous to said top surface thereof and spaced apart from said enclosed region and from said third dopant profile, to provide a ground reference for the structure;

providing a first electrode that is electrically coupled to the body region, to the source region and to said third dopant profile; and providing second, third and fourth electrodes that are electrically coupled to the drain region, the gate region and the ground region, respectively.

16. The method of claim 15, further comprising the step of providing a contact region of heavily doped second conductivity type, positioned within said third dopant profile at said top surface thereof and electrically coupled to said first electrode.

17. A method for providing MOS transistors in an electrically isolated twin tub comprising the steps of:

providing a lightly doped semiconductor substrate of a first electrical conductivity type having a top surface;

providing a covering layer of lightly doped semiconductor material of first conductivity type, contiguous to and overlying the top surface of the substrate, with the substrate and the covering layer having an interface therebetween and the covering layer having a top surface;

providing a slowly diffusing dopant of a second electrical conductivity type opposite to that of the first conductivity type at a first portion of the substrate-covering layer interface, and allowing the slowly diffusing dopant to diffuse into the covering layer to produce a first dopant profile therein;

providing a rapidly diffusing dopant of second conductivity type at a second portion of the substrate-covering layer interface that is substantially annular and adjoins and laterally surrounds the first portion of the substrate-covering layer interface, and allowing the rapidly diffusing dopant to diffuse upward into the covering layer to produce a second dopant profile therein;

providing a rapidly diffusing dopant of second conductivity type at a first portion of the top surface of the covering layer that is substantially annular and substantially overlies the second portion of the substrate-first covering layer interface, and allowing this dopant to diffuse downward into the covering layer to produce a third dopant profile that has a top surface and that meets and merges with the second dopant profile, where the first dopant profile, the second dopant profile, the third dopant profile and the top surface of the covering layer bound and define an enclosed region of the covering layer that has a top surface and that is electrically isolated from the substrate and from the remainder of the covering layer;

converting a portion, substantially 20–80 percent, of said covering layer material that forms said enclosed region from first conductivity type to second conductivity type, to form a semiconductor well of first conductivity type and a semiconductor well of second conductivity type within said enclosed region, with each well being bounded by the top surface of said enclosed region;

diffusing a dopant of first conductivity type substantially throughout the portion of said enclosed region that is not converted to second conductivity type;

providing an oxide layer overlying said top surface of said enclosed region;

providing first and second heavily doped regions of first conductivity type in said semiconductor well of second conductivity type and contiguous to said top surface thereof and spaced apart from one another;

providing first and second heavily doped regions of second conductivity type in said semiconductor well of first conductivity type and contiguous to said top surface thereof and spaced apart from one another;

providing a first gate region of doped semiconductor material contained in the oxide layer and spaced apart from said top surface of said enclosed region and overlying a portion of each of the first and second heavily doped regions of first conductivity type;

providing a second gate region of doped semiconductor material contained in the oxide layer and spaced apart form said top surface of said enclosed region and overlying a portion of each of the first and second heavily doped regions of second conductivity type;

providing first and second electrodes that are electrically coupled to the first and second heavily doped regions, respectively;

providing third and fourth electrodes that are electrically coupled to the first and second heavily doped regions of second conductivity type, respectively;

providing a fifth electrode that is electrically coupled to said third dopant profile;

providing a sixth electrode that is electrically coupled to the semiconductor well of first conductivity type; and providing first and second electrical contacts that are coupled to the first and second gate regions, respectively.

18. The method of claim 17, further comprising the step of providing a third heavily doped region of first conductivity type, positioned in said semiconductor well of first conductivity type and contiguous to said top surface thereof, which is electrically coupled to said sixth electrode.

19. The method of claim 17, further comprising the steps of:

providing a first threshold adjustment region that is doped with dopant of first conductivity type, positioned in said semiconductor well of second conductivity type and adjacent to said top surface thereof and underlying said first gate region; and providing a second threshold adjustment region that is doped with dopant of second conductivity type, positioned in said semiconductor well of first conductivity type and adjacent to said top surface thereof and underlying said second gate region.

20. A method of producing a high voltage MOS transistor in wraparound isolation comprising the steps of:

providing a lightly doped semiconductor substrate of a first electrical conductivity type having a top surface;

providing a covering layer of lightly doped semiconductor material of first conductivity type contiguous and overlying the top surface of the substrate, with the substrate and the covering layer having an interface therebetween and the covering layer having a top surface;

providing a slowly diffusing dopant of second electrical conductivity type opposite to that of the first conductivity type at a first portion of the substrate-covering layer interface, and allowing the slowly diffusing dopant to diffuse into the covering layer to produce a first dopant profile therein;

providing a rapidly diffusing dopant of second conductivity type at a second portion of the substrate-covering layer interface that is substantially annular and adjoins and laterally surrounds the first portion of the substrate-covering layer interface, and allowing the rapidly diffusing dopant to diffuse upward into the covering layer to produce a second dopant profile therein;

providing a rapidly diffusing dopant of second conductivity type at a first portion of the top surface of the covering layer that is substantially annular and substantially overlies the second portion of the substrate-first covering layer interface, and allowing this dopant to diffuse downward into the covering layer to produce a third dopant profile that has a top surface and that meets and merges with the second dopant profile, where the first dopant profile, the second dopant profile, the third dopant profile and the top surface of the covering layer bound and define an enclosed region of the covering layer that has a top surface and that is electrically isolated from the substrate and from the remainder of the covering layer;

providing a fourth dopant profile of heavily doped first conductivity type extending downward from said top surface of said covering layer and not within said enclosed region, said fourth dopant profile being spaced apart from said third dopant profile;

providing two field oxide regions at said top surface of said covering layer, the first field oxide region being substantially annular in shape and overlying and extending downward into a portion of said third dopant profile and downward into a portion of said fourth dopant profile, and the second field oxide region being substantially annular in shape and overlying and extending downward into a portion of the enclosed region;

providing a thin oxide layer of thickness substantially 0.02–0.25 $\mu$m over the upper surface of the structure;

providing a gate region of doped semiconductor material on the thin oxide layer, said gate region being substantially annular in shape and laterally surrounding and adjacent to a portion of the second field oxide region, and said gate region containing polysilicon that is doped to a resistivity of substantially 25–50 Ohm/square;

providing a fifth dopant profile of lightly doped second conductivity type within said enclosed region and adjacent to the top surface thereof where the fifth dopant profile is substantially annular and adjacent to and electrically connected to said third dopant profile and where a portion of the fifth dopant profile underlies at least a portion of the gate region;

providing a sixth dopant profile of heavily doped first conductivity type in said enclosed region adjacent to the top surface of said covering layer, said sixth dopant profile lying in an upper portion of the fifth dopant profile at a position spaced apart from said second field oxide region, and a portion of said sixth dopant profile underlying at least a portion of said gate region;

providing an seventh dopant profile of heavily doped second conductivity type within said enclosed region and adjacent to said top surface of said covering layer, said seventh dopant profile lying at an upper portion of said third dopant profile and of said enclosed region that extends from said first field oxide region to said sixth dopant profile; and providing a thick oxide layer over the upper surface of the structure.

* * * * *